(12) United States Patent
Chang

(10) Patent No.: US 11,577,276 B2
(45) Date of Patent: Feb. 14, 2023

(54) PIEZOELECTRIC MICROMACHINED ULTRASOUND TRANSDUCER DEVICE WITH MULTI-LAYER ETCHED ISOLATION TRENCH

(71) Applicant: INVENSENSE, INC., San Jose, CA (US)

(72) Inventor: Chienliu Chang, Los Altos, CA (US)

(73) Assignee: INVENSENSE, INC., San Jose, CA (US)

( * ) Notice: Subject to any disclaimer, the term of this patent is extended or adjusted under 35 U.S.C. 154(b) by 607 days.

(21) Appl. No.: 16/684,239

(22) Filed: Nov. 14, 2019

(65) Prior Publication Data

US 2020/0147644 A1 May 14, 2020

Related U.S. Application Data

(60) Provisional application No. 62/767,273, filed on Nov. 14, 2018.

(51) Int. Cl.
*B06B 1/06* (2006.01)
*B06B 1/02* (2006.01)
(Continued)

(52) U.S. Cl.
CPC .......... *B06B 1/0666* (2013.01); *B06B 1/0215* (2013.01); *B06B 1/0622* (2013.01);
(Continued)

(58) Field of Classification Search
CPC ... B06B 1/0666; B06B 1/0215; B06B 1/0622;
B06B 2201/70; B06B 1/0692; B06B 1/0696; G06V 40/1306; H01L 41/042; H01L 41/0475; H01L 41/0533; H01L 41/0825; H01L 41/29; H01L 41/313; H01L 41/332; H01L 27/20; H01L 41/0973;
(Continued)

(56) References Cited

U.S. PATENT DOCUMENTS 10,322,929 B2 6/2019 Pandian
10,497,747 B2 12/2019 Tsai
(Continued)

FOREIGN PATENT DOCUMENTS

CN 107203739 A * 9/2017
WO WO2016011172 1/2016
(Continued)

OTHER PUBLICATIONS

PCT International Search Report and Written Opinion for International Application No. PCT/US2019/061516, dated Mar. 12, 2020 (14 Pages).

*Primary Examiner* — Ermias T Woldegeorgis
(74) *Attorney, Agent, or Firm* — Haley Guiliano LLP; Joshua Van Hoven; Stefan D. Osterbur

(57) ABSTRACT

A piezoelectric micromachined ultrasonic transducer (PMUT) device includes a layer of piezoelectric material that is activated and sensed by an electrode and a conductive plane layer. The conductive plane layer may be electrically connected to processing circuitry by a via that extends through the piezoelectric layer. One or more isolation (Continued)

trenches extend through the conductive plane layer to isolate the conductive plane layer from other conductive plane layers of adjacent PMUT devices of a PMUT array.

21 Claims, 16 Drawing Sheets

(51) Int. Cl.
| | |
|---|---|
| *H01L 41/04* | (2006.01) |
| *H01L 41/047* | (2006.01) |
| *H01L 41/053* | (2006.01) |
| *H01L 41/08* | (2006.01) |
| *H01L 41/29* | (2013.01) |
| *H01L 41/313* | (2013.01) |
| *H01L 41/332* | (2013.01) |
| *G06V 40/13* | (2022.01) |

(52) U.S. Cl.
CPC ........ *G06V 40/1306* (2022.01); *H01L 41/042* (2013.01); *H01L 41/0475* (2013.01); *H01L 41/0533* (2013.01); *H01L 41/0825* (2013.01); *H01L 41/29* (2013.01); *H01L 41/313* (2013.01); *H01L 41/332* (2013.01); *B06B 2201/70* (2013.01)

(58) Field of Classification Search
CPC ............... H01L 41/047; H01L 41/0471; H01L 41/0474; H01L 41/04; H01L 41/08; H01L 41/1132

See application file for complete search history.

(56) References Cited

U.S. PATENT DOCUMENTS

| | | |
|---|---|---|
| 2013/0294201 A1 | 11/2013 | Hajati |
| 2014/0145244 A1* | 5/2014 | Daneman ............... B81B 3/0086 438/51 |
| 2015/0357375 A1* | 12/2015 | Tsai ..................... H01L 41/1132 257/416 |
| 2017/0326591 A1 | 11/2017 | Apte |
| 2018/0029882 A1* | 2/2018 | Cheng ................. B81C 1/00238 |
| 2018/0107854 A1 | 4/2018 | Tsai |
| 2018/0178251 A1 | 6/2018 | Poncellino |

FOREIGN PATENT DOCUMENTS

| | | | |
|---|---|---|---|
| WO | WO-2016011172 A1 * | 1/2016 | ........... B06B 1/0622 |
| WO | WO2016040333 | 3/2016 | |
| WO | WO2019164721 | 8/2019 | |

* cited by examiner

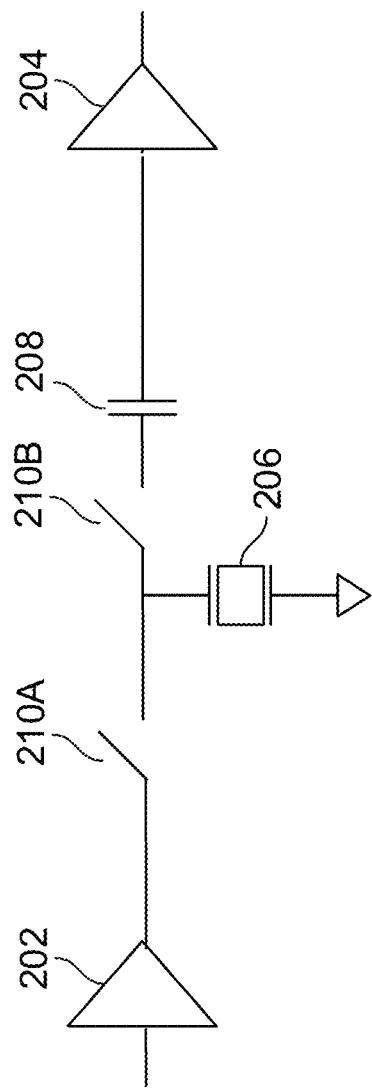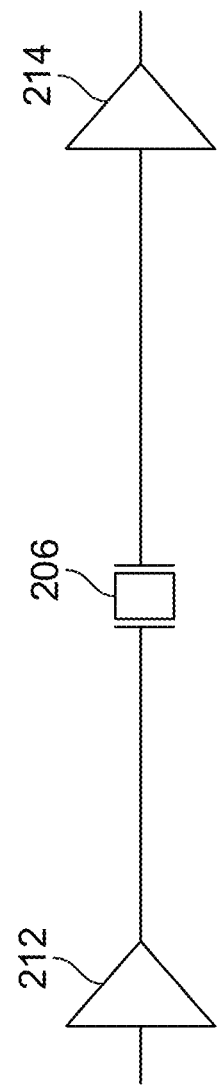
FIG. 2A
FIG. 2B

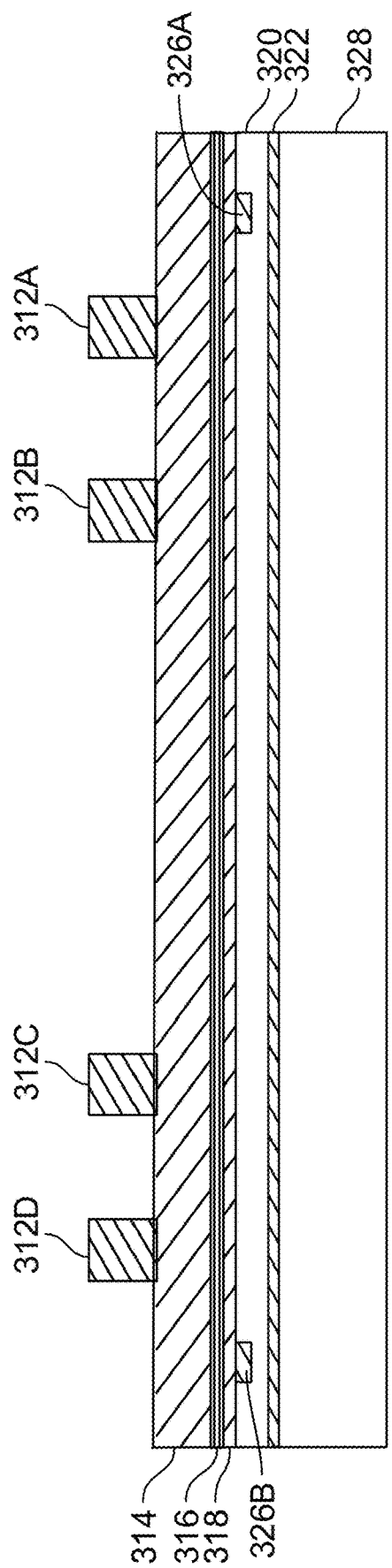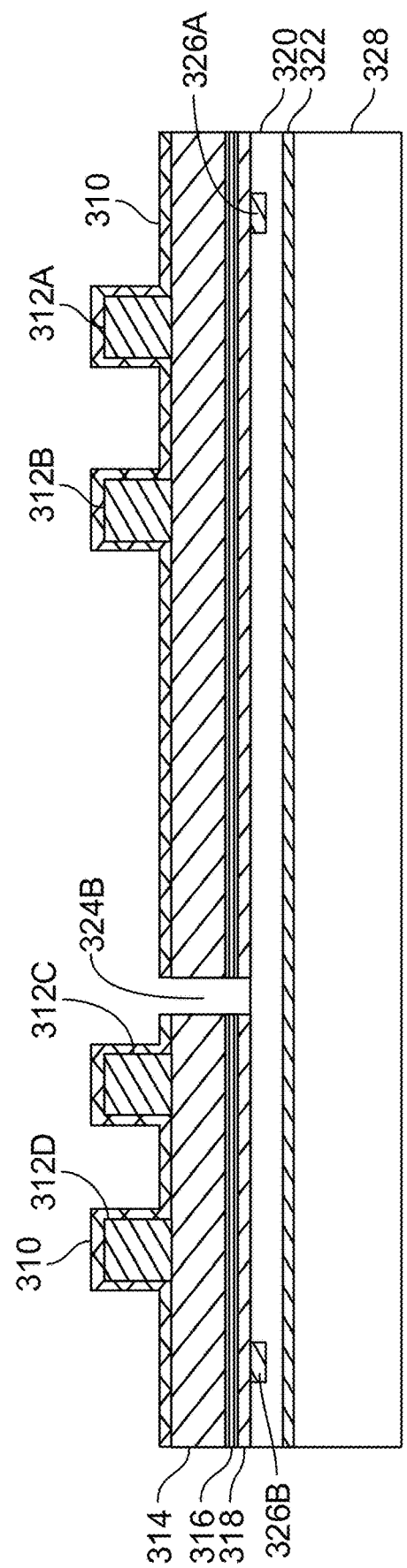

PIEZOELECTRIC MICROMACHINED ULTRASOUND TRANSDUCER DEVICE WITH MULTI-LAYER ETCHED ISOLATION TRENCH

CROSS-REFERENCE TO RELATED APPLICATIONS

This application claims priority benefit under 35 U. S. C. § 119(e) from U.S. provisional application No. 62/767,273 entitled "Dual Electrode PMUT," filed on Nov. 14, 2018. The aforementioned, earlier-filed application is hereby incorporated by reference herein in its entirety.

BACKGROUND

An ultrasound device such as a piezoelectric micromachined ultrasound transducer (PMUT) device may be utilized in a variety of applications. The ultrasound device may include a piezoelectric material that provides an electromechanical response based on a given input signal. For example, when an electrical signal is applied to the piezoelectric material, the material may exhibit a mechanical response. In response to a received mechanical signal, the piezoelectric material may exhibit an electrical response.

By designing an ultrasound device (e.g., a PMUT device or multiple PMUT devices) in a particular manner, desired signals may be produced and/or sensed. An exemplary sensor that utilizes ultrasound PMUT technology may be an ultrasound PMUT fingerprint sensor. Portions of an array of PMUT devices may be selectively activated by electrical signals to output corresponding ultrasonic signals that are transmitted in the direction of a finger. Portions of the array of PMUT devices may also be selectively activated to sense the reflections of the transmitted ultrasonic signal based on the electrical output due to the mechanical forces exerted by the reflected signals. A suitable number of PMUT devices and arrays may be implemented in order to measure the contours of the user's fingerprint based on the reflected signals.

PMUT devices may be manufactured as PMUT arrays using semiconductor manufacturing processes. In ultrasound sensors, these PMUT arrays may form an ultrasonic transducer array. Different layers of material may be deposited, etched, and processed in a sequential set of operations to build the PMUT array and individual PMUT devices. It may be desirable for adjacent PMUT devices of a PMUT array to have shared or interconnected components constructed from shared layers of material to increase the efficiency of the manufacturing process.

SUMMARY

In an exemplary embodiment of the present disclosure, a piezoelectric micromachined ultrasonic transducer (PMUT) device may comprise a processing layer, a piezoelectric layer, a structural layer, and an electrode located between the piezoelectric layer and the processing layer. In an embodiment, the PMUT device may further comprise a conductive plane layer located between the piezoelectric layer and the structural layer, a first electrical connection between the processing layer and the electrode, and a second electrical connection between the processing layer and the conductive plane layer, wherein the second electrical connection extends through the piezoelectric layer. In an embodiment, the PMUT device may further comprise an isolation trench that extends through the conductive plane layer and at least one of the piezoelectric layer or the structural layer, wherein the isolation trench surrounds the conductive plane layer within the PMUT device.

In an exemplary embodiment of the present disclosure, an exemplary piezoelectric micromachined ultrasonic transducer (PMUT) array comprises a plurality of PMUT devices. In an embodiment, each of the PMUT devices may comprise a piezoelectric layer, a structural layer, an electrode located between the piezoelectric layer and the processing layer, a conductive plane layer located between the piezoelectric layer and the structural layer, a first electrical connection between the processing layer and the electrode, and a second electrical connection between the processing layer and the conductive plane layer, wherein the second electrical connection extends through the piezoelectric layer. In an embodiment, a plurality of isolation trenches extend through the conductive plane layers of adjacent PMUT devices, wherein the plurality of isolation trenches electrically isolate the conductive plane layers of the adjacent PMUT devices from each other.

In an exemplary embodiment of the present disclosure, a method of fabricating a piezoelectric micromachined ultrasonic transducer (PMUT) device may comprise preparing a structural wafer comprising at least an insulating oxide layer and a structural layer, depositing a conductive plane layer over the structural layer, depositing a piezoelectric layer over the conductive plane layer, depositing a plurality of oxide standoffs over a portion of the piezoelectric layer and etching a via through the piezoelectric layer at least to the conductive plane layer. In an embodiment, the method may further comprise depositing an electrical connection layer over the standoffs and the piezoelectric layer, wherein the electrical connection layer extends into the via at least to the conductive plane layer. In an embodiment, the method may further comprise patterning the electrical connection layer and etching a plurality of trenches, where the plurality of trenches extend through the piezoelectric layer and the conductive plane layer to surround the conductive plane layer within the PMUT device.

BRIEF DESCRIPTION OF THE DRAWINGS

The above and other features of the present disclosure, its nature and various advantages will be more apparent upon consideration of the following detailed description, taken in conjunction with the accompanying drawings in which:

FIG. 2A shows an exemplary schematic of a PMUT device including a piezoelectric element in a single drive configuration in accordance with an embodiment of the present disclosure;

FIG. 2B shows an exemplary schematic of a dual-electrode PMUT device including a series-connected piezoelectric element in accordance with an embodiment of the present disclosure;

FIG. 6 shows exemplary steps of fabricating a seed layer, conductive layer, piezoelectric layer, standoffs of the dual electrode PMUT device of FIG. 3D in accordance with an embodiment of the present disclosure;

FIG. 7 shows exemplary steps of fabricating an insulating layer and via of the dual electrode PMUT device of FIG. 3D in accordance with an embodiment of the present disclosure;

DETAILED DESCRIPTION OF THE DRAWINGS

Figure 1:
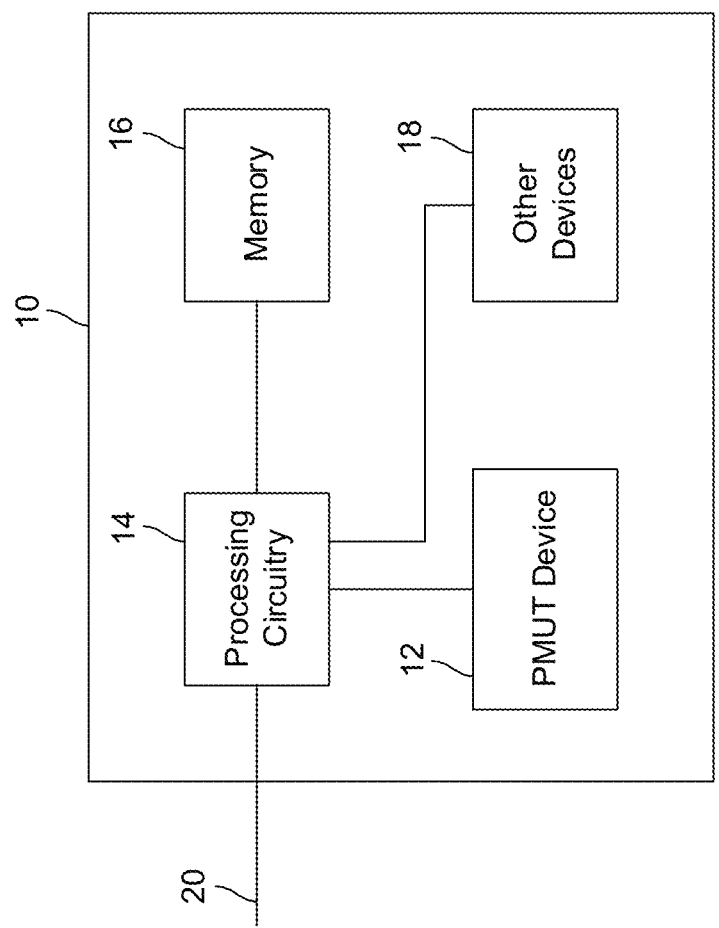
FIG. 1 depicts an exemplary fingerprint sensing system in accordance with some embodiments of the present disclosure.

Microelectromechanical systems (MEMS) may refer to a class of structure or devices fabricated using semiconductor-like processes and exhibiting mechanical characteristics such as the ability to move or deform. MEMS often, but not always interact with electrical signals. Fingerprint sensing through MEMS devices may be achieved through an array of piezoelectric micromachined ultrasound transducer (PMUT) devices. The general principle of these devices is that they transmit ultrasonic waves which may interact with object position on or close to the device, such as a fingerprint sensor interacting with the end of a finger. By detecting and analyzing the reflected waves, characteristics of the object can be determined. In the case of an ultrasonic fingerprint sensor, the sensor may be used to acquire a fingerprint image of a finger pressed on the sensor. PMUT devices may have additional applications in any suitable application wherein ultrasonic signals may be used to identify physical characteristics of interest (e.g., medical imaging, where an image of a biometric surface may be captured by an array of PMUT devices). In this manner, an array of PMUT devices may be operated at a suitable power and frequency to generate ultrasonic signals suitable for providing ultrasonic signals to a region of interest, receiving reflections of those signals, and generating a composite image based on the reflected signals.

A PMUT array may be fabricated according to semiconductor manufacturing processes as numerous PMUT devices arranged in a suitable pattern for a particular end-use application (e.g., dozens of PMUT devices arranged adjacent to each other to perform fingerprint sensing). The adjacent PMUT devices of a PMUT array are fabricated simultaneously as a substrate (e.g., a wafer) that progresses sequentially through processing operations such as deposition, doping, patterning, etching, and other standard operations.

An exemplary MEMS PMUT device comprise a number of layers, including a piezoelectric layer of a material that generates a mechanical response to an applied electrical signal (e.g., to generate a desired ultrasonic output signal) and an electrical signal in response to an applied mechanical force (e.g., from a received reflected ultrasonic signal). The PMUT device may also include a processing layer that includes signal paths and signal processing circuitry (e.g., amplifiers, filters, etc.) for providing and receiving the electrical signals to and from the piezoelectric layer. In order to generate the desired ultrasonic output and to process the received reflections, it may be desirable for the piezoelectric layer to be a relatively thick layer within the PMUT device and to extend over most of the planar area of the PMUT device. For example, a high stiffness of the vibrating membrane may provide a restoring force after electrical actuation at a certain frequencies within ultrasonic propagation ranges. Electrical signals are applied to and received from the piezoelectric layer by electrodes on opposite sides of the piezoelectric layer. One of the electrodes may be fabricated at a point of the process at which it can be selectively patterned such that an electrical connection can extend between the processing layer (e.g., to and/or from an amplifier of the processing layer) while the second electrode may be fabricated as a conductive plane layer at a stage of the process that makes patterning more difficult. A via through a portion of the piezoelectric layer may be required to provide an electrical connection between the processing layer (e.g., a second amplifier of the processing layer) and the second electrode.

Because adjacent PMUT devices are fabricated simultaneously in a dense pattern, some of the layers may be fabricated such that they extend in a continuous plane between adjacent PMUT devices. For inactive layers such as oxide and/or structural layers, the physical connection by the planes between adjacent PMUT devices may have a limited effect on the operation of adjacent PMUT devices. However, if a conductive plane layer of one PMUT device is electrically connected to a conductive plane layer of an adjacent PMUT device, the conductive plane layers of the respective devices cannot be operated independently, limiting the flexibility of the operations of the PMUT devices of the PMUT array and requiring additional circuitry (such as coupling capacitors) to capture and process signals of interest.

Trenches may be etched during the fabrication of the PMUT devices to electrically isolate the conductive plane layers of adjacent PMUT devices from each other. For each PMUT device, the conductive plane layer may be located between the piezoelectric layer and a structural layer (e.g., that provides structural rigidity to the PMUT device and influences the ultrasonic output of the PMUT device), with other layers such as seed and oxide layers between the conductive plane layer and structural layer, depending on particular fabrication processes and/or structure designs. The etching of the PMUT device may electrically isolate the conductive plane layers of adjacent PMUT devices from each other, for example, by etching through and surrounding the conductive plane layer such that there is no direct electrical connection between adjacent PMUT devices within the conductive plane layers.

The trenches (e.g., isolation trenches) may be etched through the conductive plane layer in a variety of different manners. In an embodiment, the isolation trench may be etched from the direction of the piezoelectric layer through the piezoelectric layer and the overlaying conductive plane layer, such that the trench is etched through to the seed or structural layer overlaying the conductive plane layer. In some embodiments, the isolation trench may be etched from the structural layer through the structural layer and the conductive layer, such that the trench is etched through to the piezoelectric layer or to other underlying layers or components such as structural standoffs. In some embodiments, the isolation trench may be etched through all of the structural layer, conductive plane layer, and piezoelectric layer. Thus, adjacent PMUT devices may not be electrically or physically connected at the level of these layers, which may limit the possibility of unintentional electrical connections or parasitic paths being formed during fabrication. An additional layer (e.g., an insulating oxide layer) may be added to at least partially fill the trench, providing an additional physical connection between adjacent PMUT devices. In some embodiments, this additional layer may be a "plug" that is prefabricated at a desired location (e.g., within the structural layer) to facilitate etching to the plug during fabrication and providing structural connection between adjacent PMUT devices without facilitating an electrical connection between adjacent conductive plane layers.

A piezoelectric circuit including the processing layer, the piezoelectric layer, the patterned electrode, and the conductive plane layer may enable the selective and individualized control and operation of the individual PMUT devices of the PMUT array in order to apply, receive, and process piezoelectric signals. For example, each of the patterned electrode or the conductive plane layer may be electrically connected to respective send (TX) and receive (RX) amplifiers to generate and receive ultrasonic signals. In some embodiments, additional flexibility may be provided by switching circuitry (e.g., within the processing layer) to selectively connect the patterned electrode and conductive plane layer to different sources and processing circuitry.

FIG. 1 depicts an exemplary PMUT sensor system such as a fingerprint sensing system 10 in accordance with some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the PMUT sensor system may include at least a MEMS piezoelectric sensor 12 and supporting circuitry, such as processing circuitry 14 and memory 16. In some embodiments, one or more additional sensors 18 (e.g., MEMS gyroscopes, MEMS accelerometers, MEMS pressure sensors, and a compass) may be included within the fingerprint sensing system 10.

Processing circuitry 14 may include one or more components providing necessary processing based on the requirements of the fingerprint processing system 10. In some embodiments, processing circuitry 14 may include hardware control logic that may be integrated within a chip of a sensor (e.g., within a processing layer of a MEMS piezoelectric sensor 12, or on a portion of a chip adjacent to the MEMS piezoelectric sensor 12 and/or additional sensors 18) to control the operation of the MEMS piezoelectric sensor 12 or additional sensors 18 and perform aspects of processing for the MEMS piezoelectric sensor 12 or additional sensors 18. In some embodiments, the MEMS piezoelectric sensor 12 and additional sensors 18 may include one or more registers that allow aspects of the operation of hardware control logic to be modified (e.g., by modifying a value of a register). For example, in some embodiments, one or registers may be modified to change values (e.g., resistors, capacitors, filters, etc.) associated with the processing circuitry described herein. In some embodiments, processing circuitry 14 may also include a processor such as a microprocessor that executes software instructions, e.g., that are stored in memory 16. The microprocessor may control the operation of the MEMS piezoelectric sensor 12 by interacting with the hardware control logic and process signals received from MEMS piezoelectric sensor 12. The microprocessor may interact with other sensors in a similar manner.

FIG. 2A shows an exemplary schematic of a PMUT device including a piezoelectric element in a single drive configuration in accordance with an embodiment of the present disclosure. The exemplary embodiment depicted in FIG. 2A corresponds to a PMUT array including a shared conductive ground plane (or other desirable potential) that physically and electrically connects between adjacent PMUT devices. An electrode is electrically coupled between a processing layer and one side of a piezoelectric layer, which is represented in FIG. 2A as piezoelectric element 206 with an upper bar corresponding to the electrode. The other side of the piezoelectric layer (e.g., piezoelectric element 206) is coupled to the conductive ground plane (represented as a bar on the other side of the piezoelectric element 206), which is permanently connected to ground and shared between the PMUT devices. Respective switches 210A and 210B of each PMUT device selectively switch the components within the processing layer such that a first amplifier 202 provides an electrical signal to the piezoelectric element 206 to generate an ultrasonic output when switch 210A is closed and switch 210B open (i.e., a transmit path) and a capacitor 208 and second amplifier 204 are connected to receive an electrical output signal from the piezoelectric element 206 due to a received ultrasonic reflection when switch 210B is closed and switch 210A open (i.e., a receive path). In this manner, by selectively switching the connection from the piezoelectric element 206 to the transmit path or receive path, a single piezoelectric element can be used for sending and receiving ultrasonic signals, despite one side of the piezoelectric element being connected to the conductive ground plane. The capacitor 208 serves to protect the receiver circuit during transmit portions of the cycle, but also functions as a capacitive divider, reducing signal strength and resolution.

FIG. 2B shows an exemplary schematic of a dual-electrode PMUT device including a series-connected piezoelectric element in accordance with an embodiment of the present disclosure. In the exemplary embodiment of FIG. 2B, an electrical connection is provided between the processing layer and each of an electrode and a conductive plane layer on opposing sides of piezoelectric layer (i.e., piezoelectric element 206). The conductive plane layer may be electrically isolated from conductive plane layers of adjacent PMUT devices of a PMUT array. Because each conductive plane layer is independently connected to an associated processing layer of the respective PMUT device, the conductive plane layer serving as the electrode need not be connected to ground and may instead be connected to processing circuitry of the processing layer. In the exemplary embodiment of FIG. 2B, the lower electrode of the PMUT device is coupled to transmit amplifier 212 while the upper electrode of the conductive plane layer of the PMUT device is coupled to receive amplifier 214 (or vice-versa) by a via. Although switching between different electrical components within the processing layer may occur in some embodiments (not depicted in FIG. 2B), in the exemplary embodiment of FIG. 2B the respective amplifiers 212 and 214 may be connected to the piezoelectric element 206 via the two active electrodes and may perform transmit (e.g., amplifier 212) and receive (e.g., amplifier 214) operations. During a first period of operation, the transmit signal may be provided via transmit amplifier 212. During a second period of operation, the transmit amplifier 212 (TX) may not transmit a signal and the receive amplifier 214 (RX) may process received reflections. In an exemplary embodiment, with similar amplifier and piezoelectric components, the dual-electrode PMUT device of FIG. 2B may experience up to a 3 dB improvement in sensitivity as compared to the ground-connected PMUT device of FIG. 2A.

In the dual electrode architecture, the different top and bottom elements can be controlled separately during transmit mode and receive mode. For example, in transmit mode, one of the electrodes can be used as a drive electrode and the other electrode can be grounded, or at another desired potential. In receive mode, one of the electrodes can be used to receive the signal and the other electrode can be grounded, or at another desired potential. Electrode functionality can be inverted between transmit mode and receive mode. Switches in the substrate can be used to change functionality of the different electrodes during the various modes. For example, the first pair of electrode elements can be connected to a first switch (e.g., switching element), which can be operable between a first position and a second position. According to some implementations, the switch can be similar to a Double Pole Double Throw (DPDT) switch or another type of switch.

Figure 2C:
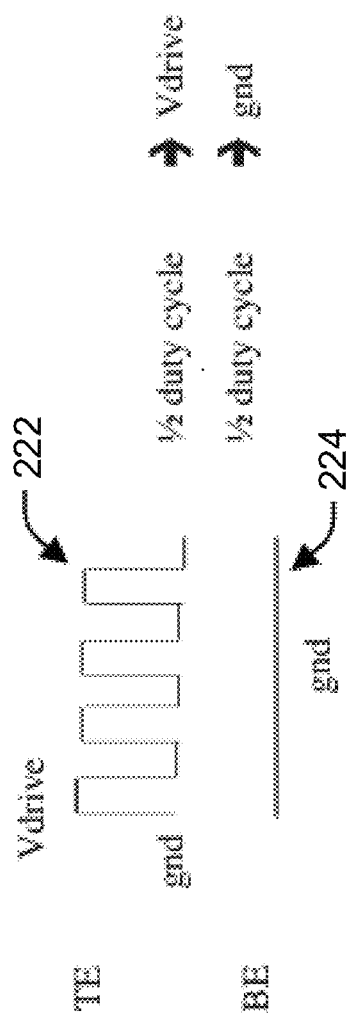
FIG. 2C shows an exemplary schematic representation of signals for a sensor that comprises a single drive such as the sensor of FIG. 2B, in accordance with some embodiments of the present disclosure.

FIG. 2C shows an exemplary schematic representation of signals for a sensor that comprises a single drive such as the sensor of FIG. 2A, in accordance with some embodiments of the present disclosure. Illustrated are a first signal 222 for a top electrode (TE) and a second signal 224 for a bottom electrode (BE). This architecture (single drive) uses the same electrode for transmit and receive, as in the configuration of FIG. 2A. In this example, the bottom electrode can be tied to electrical ground (although in some implementations, the top electrode can be tied to electrical ground). Accordingly, the first signal 222 has a waveform that is between ground and Vdrive, during a drive signal. The second signal 224 is tied to electrical ground, or any other desired potential. Accordingly, one electrode is used as a drive electrode and the other electrode is held at a constant potential. This created potential variation across the piezoelectric element generates the ultrasound waves. Accordingly, there is a half duty cycle for Vdrive and a half duty cycle for ground (or other potential), although other percentages can also be used. The square waveform is used to explain the principles, but any type of waveform can be used (e.g., sine form). Because the same electrode is used for the transmission circuit and the receiving circuit, a coupling capacitor is needed between the transmission circuit and the receiving circuit. This results in signal loss due to the presence of the capacitive divider.

Figure 2D:
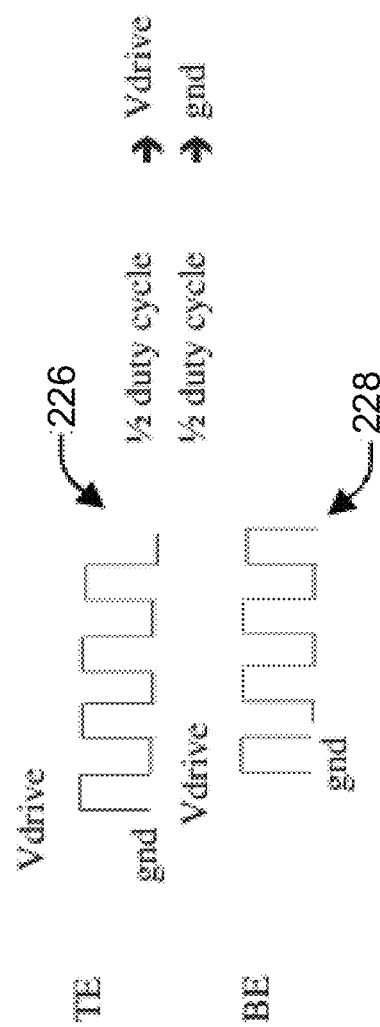
FIG. 2D shows an exemplary schematic representation of signals for a sensor that comprises a differential drive such as the sensor of FIG. 2B, in accordance with some embodiments of the present disclosure.

FIG. 2D shows an exemplary schematic representation of signals for a sensor that comprises a differential drive that can be implemented such as by the sensor of FIG. 2B in accordance with some embodiments of the present disclosure, although the configuration of FIG. 2B may also implement a single drive. The differential drive mode is enabled due to the dual electrode architecture. In the dual drive mode, both electrodes are used as drive electrodes, meaning they both have a varying potential in order to generate the ultrasonic waves. By using separate electrodes for the transmission and receiving, the coupling capacitor of the single drive configuration not needed, resulting in increased performance. For the differential drive, the electrodes used for TX can be driven with differential signal, providing around 6 dB higher TX pressure compared to a single-ended drive. For differential sense, the electrodes used for RX can be arranged such that the electrodes contact parts of the piezo film with out-of-phase stress. Taking as differential signal across these electrodes can help increase the RX signal.

Illustrated in FIG. 2D a first signal 226 for a top electrode or TE (e.g., the conductive plane layer described herein) and a second signal 228 for a bottom electrode or BE (e.g., the lower electrode opposite the conductive plane layer as described herein). With the differential drive as discussed herein, the first signal 226 can have a similar waveform as the single drive. However, the second signal 228 has a waveform that is inverse to the first signal 226 (e.g., a phase shift, a 180 degree difference between a transmit state and a receive state). Other suitable phase shifts can also be applied depending, for example, on the transducer design. With the inverse polarity, the piezoelectric layer can be driven with more force as compared to the sensor of FIGS. 2A and 2C. The half duty cycle in both cases is Vdrive and, therefore, twice the power can be output without inputting twice the amount of power. The voltage variation amplitude and used maximum and minimum voltage for the bottom and top electrodes can be identical, or they can be different. Accordingly, more signal can be achieved resulting in better sensor performance. The differential drive mode is used during the transmission phase, and the subsequent receive phase can use any of the variations discussed above. In addition to the differential drive mode, a differential receive mode can also be used due to the dual electrode architecture. For example, as the membrane flexes during receive, strain induced charges are generated across the piezo layer. Due to the different polarity of the charges induced as a function of the direction of the bending strains, the electrodes can be designed according to the shape and location of these strains to capture the differential signals.

In some embodiments not specifically depicted herein, a piezoelectric sensor may include additional electrodes and/or multiple piezoelectric layers. For example, rather than a single actuating conductive plane layer and a single lower electrode layer, one or both of these layers may be split into multiple layers for actuation and sensing by different processing circuitry connections, enabling a variety of dedicated or changing functions in transmit mode or receive mode. In some embodiments, additional electrodes may be embedded between piezoelectric layers, allowing different patterns and functionality for actuation and sensing.

Figure 3A:
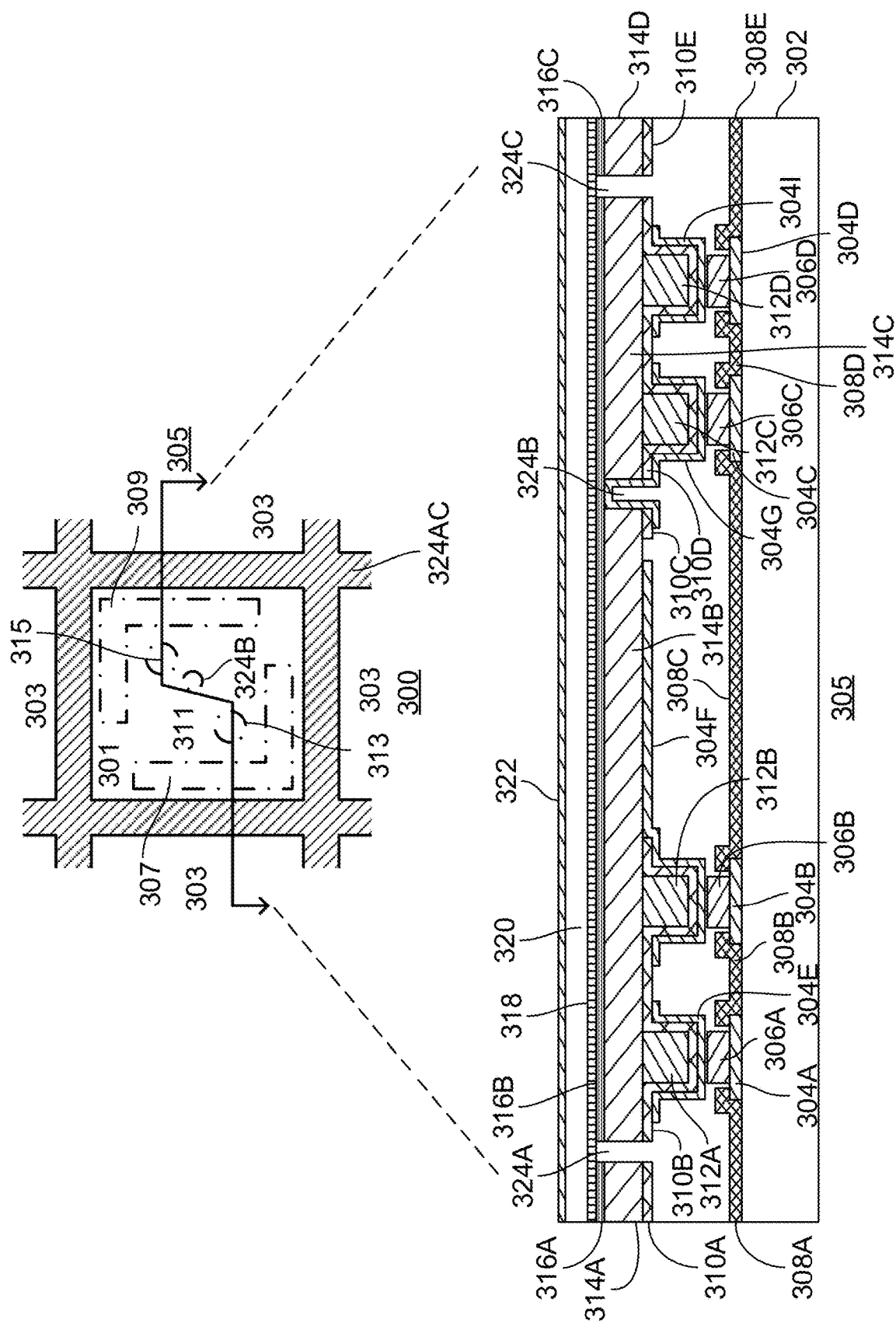
FIG. 3A shows an exemplary top and section view of a first embodiment of a dual electrode PMUT device including a series-connected piezoelectric element in accordance with an embodiment of the present disclosure.

FIG. 3A shows an exemplary top and section view of a first embodiment of a dual electrode PMUT device including a series-connected piezoelectric element in accordance with an embodiment of the present disclosure. In the context of FIG. 3A and the other figures of the present disclosure, a dual electrode PMUT having particular materials, layers, and end-use functionality will be described. However, it will be understood that the present disclosure may apply to any suitable piezoelectric application created through semiconductor manufacturing processes, in order to provide improved functionality and isolation, and to improve control and processing options for complex applications. Although particular materials and/or classes of materials may be described herein, it will be understood that additional materials and/or classes of materials may be utilized in some embodiments. In the exemplary embodiments described herein, one class of material may be a conductive or electrode material, which may include materials such as Molybdenum (Mo), Aluminum (Al), Titanium Nitride (TiN), other suitable conductive materials, and combinations thereof. Another class of materials discussed herein may include insulating or oxide layers, such as silicon dioxide, other suitable materials, and combinations thereof. Another class of materials discussed herein may include piezoelectric materials, such aluminum nitride (AlN), Scandium doped aluminum nitride (Sc-AlN), lead zirconate titanate (PZT), PVFD or similar piezoelectric polymers, other suitable piezoelectric materials, and combinations thereof. Another class of materials discussed herein may include structural materials, such as silicon, other suitable structural materials, and combinations thereof. Another class of materials may include a processing layer for forming processing circuitry (e.g., amplifiers, capacitors, filters, transistors, control circuitry, etc.) such as a complementary metal-oxide-semiconductor (CMOS) processing layer, other suitable processing layers or materials, and combinations thereof. Another class of materials may include bonding materials for bonding fabricated portions of a device, which may include materials such as germanium, aluminum, other suitable bonding materials, and combinations thereof. For example, in an embodiment of the present disclosure, a fabricated MEMS PMUT wafer may include a conductive layer and electrodes, structural layers, a piezoelectric layer, a number of insulating layers and features, and bonding features. A fabricated CMOS processing layer may include processing circuitry and bonding features, and may be bonded to the MEMS PMUT layer by eutectic bonding of the respective bonding features, such that the processing circuitry of the CMOS processing layer is in electrical communication with the conductive layers and features of the MEMS PMUT layer via the eutectic bonds.

Top view 300 of FIG. 3A depicts an exemplary top view of the PMUT device 301 adjacent to other PMUT devices 303 in a PMUT array. An exemplary trench 324AC surrounds the PMUT device 301 and separates certain layers of the PMUT device 301 from adjacent PMUT devices 303 as depicted in more detail in the section view 305 of FIG. 3A. In the embodiment of FIG. 3A, exemplary support structures 307 and 309 are electrically inactive and define a region 311 for the piezoelectric material to be electrically and/or mechanically excited. Support structure 307 may correspond to contact pad 304A and electrode 304E, standoff 312A, and germanium bond 306A in section view 305. Support structure 309 may correspond to contact pad 304D and electrode 304I, standoff 312D, and germanium bond 306D in section view 305. In the embodiment of FIG. 3A, exemplary support structures 313 and 315 are electrically active and provide the electrical connections from the processing layer 302 to the active electrodes 304F and 304G, and via electrode 304G and via 324B to the conductive plane layer 316B. In this manner, the support structures 313 and 315 provide and receive the electrical signals to and from the piezoelectric layer 314B/314C depicted in the section view 305 of FIG. 3A. Although a particular number, configuration, and designation (e.g., active vs. inactive) of the support structures is depicted in FIGS. 3A-3D, it will be understood that the support structures can be arranged in a variety of patterns based on desired electrical and ultrasonic parameters of the PMUT devices. In the exemplary embodiments of FIGS. 3A-3D, the centrally located region 311 defines the ultrasonic characteristics of the PMUT resonator (e.g., generally constricted about the outside edges of the resonator). Other designs and support structure locations may be selected to provide desired output and receive features, characteristics, and sensitivity. In some embodiments, additional electrically active support structures may be added and/or electrically inactive support structures may be added or removed. Some non-limiting examples of support structure locations and PMUT configurations are depicted and described in FIG. 4 herein.

Section view 305 depicts a processing layer 302 defining a bottom layer of the PMUT device. An exemplary processing layer 302 may be a CMOS layer and may include circuitry such as amplifiers, capacitors, transistors, filters, and/or additional processing circuitry for sending, receiving, processing, and/or analyzing ultrasonic signals of the PMUT device. In some embodiments, some or all of this processing circuitry may be located remotely from the processing layer, such that the processing layer 302 primarily facilitates the sending and receiving of ultrasonic signals while processing is performed elsewhere.

A plurality of contact pads 304A-304B may be located on an upper surface of processing layer 302, and at least some of the electrodes (e.g., electrically active contact pads 304B and 304C) may be electrically coupled to active circuitry (e.g., send and receive amplifiers 212 and 214) within processing layer 302 (not depicted in FIG. 3A). The contact pads 304A-304D may be a conductive material such as Al, TiN, or other suitable materials as described herein. An associated portion of bonding material 306A-306D (e.g., germanium or other bonding materials as described herein) may be located on and associated with each of the contact pads 304A-304D, to provide a conductive bond between the contact pads 304A-304D (and thus the processing layer 302) and electrodes 304E-304H (and thus, piezoelectric layer 314B/314C). A passivation layer 308A-308F (e.g., a silicon dioxide passivation layer) may overlay portions of the processing layer 302 and contact pads 304A-304D, but may have a thickness that is less than that of the bonding portions 306A-306D, to prevent interference with the bonding to the electrodes 304E-304H.

The electrodes 304E-304H may at least partially overlay an insulating layer 310B, 310C, and 310D, for example, of an SiO$_2$ hardmask. For example, electrode 304E may entirely overlay a portion of insulating layer 310B, which in turn overlays standoff 312A (e.g., a standoff of an insulating material such as SiO$_2$ or other materials, as described herein) and piezoelectric layer 314B (e.g., a piezoelectric material of AlN or other suitable piezoelectric materials, as described herein), providing electrical isolation between electrode 304E and the piezoelectric layer 314B. In this manner, electrode 304E may not be electrically active. Electrode 304F may partially overlay a portion of insulating layer 310B, which in turn overlays standoff 312B and portions of piezoelectric layer 314B. However, electrode 304F may also be in contact with piezoelectric layer 314B, such that electrode 304F is electrically active and provides an electrical connection between the lower surface of piezoelectric layer 314B and processing layer 302. Electrode 304G may partially overlay a portion of insulating layer 310C and insulting layer 310D, which in turn overlay standoff 312C and portions of piezoelectric layer portions 314B and 314C. In this manner, electrode 304G may be electrically isolated from the lower surface of piezoelectric layer portions 314B and 314C. However, electrode 304G may extend through the piezoelectric layer between piezoelectric layer portions 314B and 314C in via 324B to be in contact with a conductive plane layer 316B, which may be a suitable conductive material such as Molybdenum or other suitable materials as described herein. In this manner, electrode 304G is electrically active and provides an electrical connection between conductive plane layer 316B (which in turn covers the upper surface of piezoelectric layer portions 314B and 314C) and processing layer 302. In some embodiments (not depicted), an additional protective (e.g., insulating layer) may be located between the electrode 304G and the piezoelectric layer portions, for example, to limit diffusion.

A seed layer 318 may be located over the conductive plane layer 316B. A structural layer 320 (e.g., of silicon or other suitable materials) may be located over seed layer 318 and may provide structural support for the piezoelectric material during fabrication and end-use operation. An insulating layer 322 (e.g., of SiO$_2$ or other suitable materials) may be located over the structural layer 320. Trenches 324A and 324C and via 324B may be fabricated to extend through certain layers of the MEMS device. In the exemplary embodiment of FIG. 3A, trenches 324A and 324C extend through the insulating layer 310, piezoelectric layer 314, and conductive plane layer 316 to physically and electrically separate these adjacent layers from each other between adjacent PMUT devices, forming an isolation trench 324AC around these components. In the embodiment of FIG. 3A, insulating layer portion 310A, piezoelectric layer portion 314A, and conductive plane layer portion 316A may all be components of an adjacent PMUT device 303 to the left of PMUT device 301 (not depicted in additional detail in FIG. 3A) while insulating layer portion 310E, piezoelectric layer portion 314D, and conductive plane layer portion 316C may all be components of an adjacent PMUT device 303 to the right of PMUT device 301 (not depicted in additional detail in FIG. 3A). In this manner, trenches 324A and 324C serve to separate adjacent PMUT devices, and particularly, the conductive plane layers 316 of adjacent PMUT devices, such that signals may be independently provided to and received by the respective conductive plane layers.

In the exemplary embodiment of FIG. 3A, via 324B extends between insulating layer portions 310C and 310D, and further between piezoelectric layer portions 314B and 314C. In this manner, electrode 304G may be formed in via 324B in order to connect conductive plane layer portion 316B to processing layer 302 (e.g., via germanium bond 306C and contact pad 304C). This connection allows components of processing layer 302 direct electrical access and control of the signals provided to and received by conductive plane layer portion 316B of PMUT device 301. Although not depicted in FIG. 3A, in some embodiments via 324B may also extend through the conductive plane layer to the seed layer. Although the via 324B may have a variety of suitable shapes, in an exemplary embodiment as depicted in FIG. 3A the trench 324A may be generally cylindrical in shape.

Figure 3B:
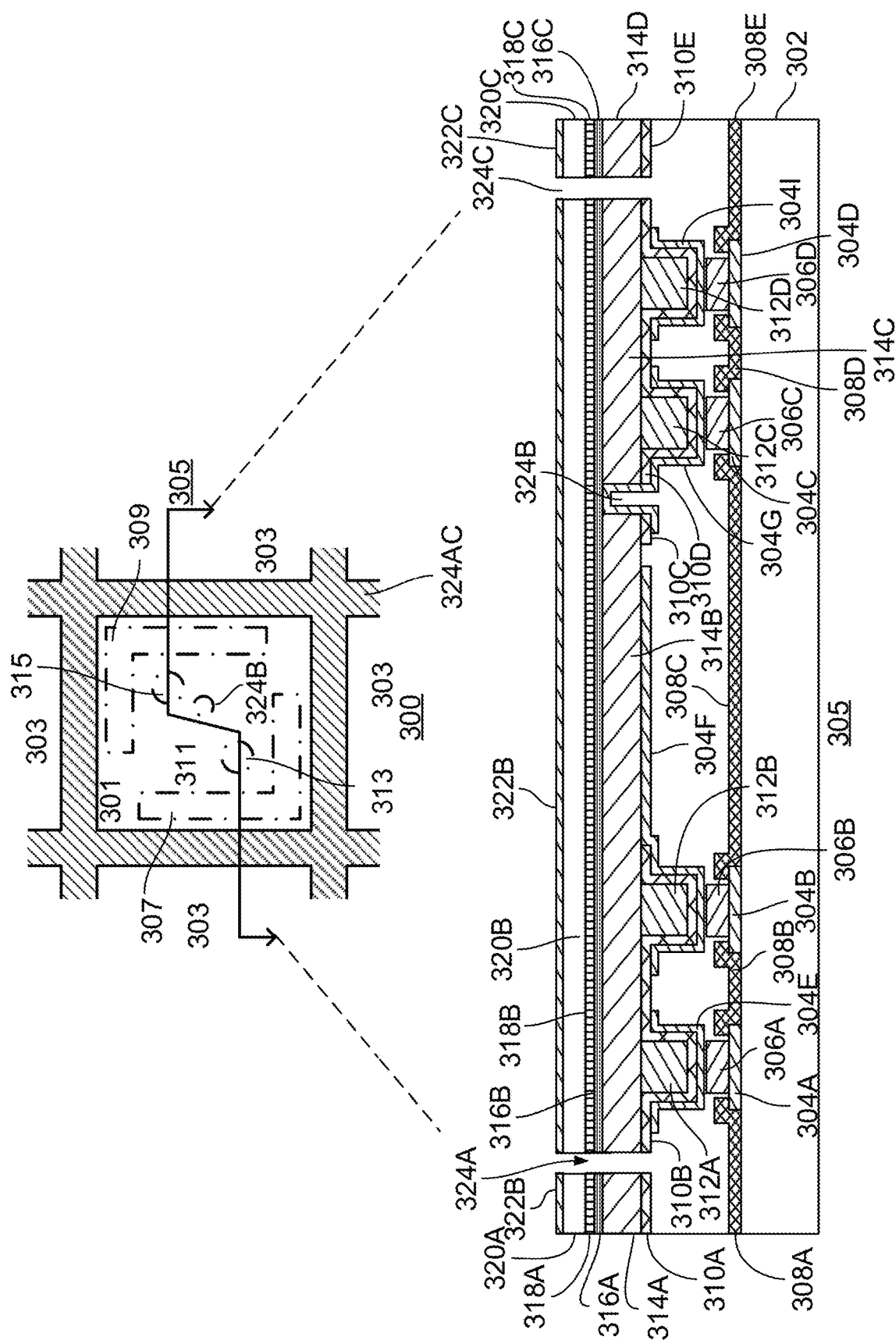
FIG. 3B shows an exemplary top and section view of a second embodiment of a dual electrode PMUT device including a series-connected piezoelectric element in accordance with an embodiment of the present disclosure.

FIG. 3B shows an exemplary top and section view of a second embodiment of a dual electrode PMUT device including a series-connected piezoelectric element in accordance with an embodiment of the present disclosure. Most of the components of the embodiment of FIG. 3B are substantially identical to those described in FIG. 3A, for example, including but not limited to the material layers and components from the processing layer 302 through the piezoelectric layer portions 314A-314C. In the exemplary embodiment of FIG. 3B, the trenches 324A and 324C may extend through additional layers. Although the trenches 324A and 324C may extend through a number of suitable layers or combinations thereof (e.g., seed layer 318 or seed layer 318 and structural layer 320), in the exemplary embodiment of FIG. 3B the trenches 324A and 324C extend through all of the upper wafer layers of the PMUT device 301 (e.g., seed layer 318, structural layer 320, and insulating layer 322) to form an open trench between PMUT device 301 and adjacent PMUT devices 303.

In the exemplary embodiment of FIG. 3B, trenches 324A and 324C extend through the insulating layer 310, piezoelectric layer 314, conductive plane layer 316, seed layer 318, structural layer 320, and insulating layer 322 to physically and electrically separate these adjacent layers from each other between adjacent PMUT devices. In the embodiment of FIG. 3B, insulating layer portion 310A, piezoelectric layer portion 314A, conductive plane layer portion 316A, seed layer portion 318A, structural layer portion 320A, and insulating layer portion 322A may all be components of an adjacent PMUT device 303 to the left of PMUT device 301 (not depicted in additional detail in FIG. 3B), while insulating layer portion 310E, piezoelectric layer portion 314D, conductive plane layer portion 316C, seed layer portion 318C, structural layer portion 320C, and insulating layer portion 322C may all be components of an adjacent PMUT device 303 to the right of PMUT device 301 (not depicted in additional detail in FIG. 3B). In this manner, trenches 324A and 324C serve to separate adjacent PMUT devices, and particularly, the conductive plane layers 316 of adjacent PMUT devices, such that signals may be independently provided to and received by the respective conductive plane layers. In the exemplary embodiment of FIG. 3B the physical and electrical separation is complete, such that it is not possible for even parasitic signals to pass between adjacent PMUT devices.

In the exemplary embodiment of FIG. 3B, via 324B extends between insulating layer portions 310C and 310D, and further between piezoelectric layer portions 314B and 314C and seed layer portions 318B and 318C. In this manner, electrode 304G may be formed in via 324B in order to connect conductive plane layer portion 316B to processing layer 302 (e.g., via germanium bond 306C and contact pad 304C). This connection allows components of processing layer 302 direct electrical access and control of the signals provided to and received by conductive plane layer portion 316B of PMUT device 301. Although not depicted in FIG. 3B, in some embodiments via 324B may not extend through the conductive plane layer to the seed layer, such that the electrode 304G provides an electrical connection to the bottom of a portion of the conductive plane layer portion 316B. Although the via 324B may have a variety of suitable shapes, in an exemplary embodiment as depicted in FIG. 3B the via 324B may be generally cylindrical in shape.

Figure 3C:
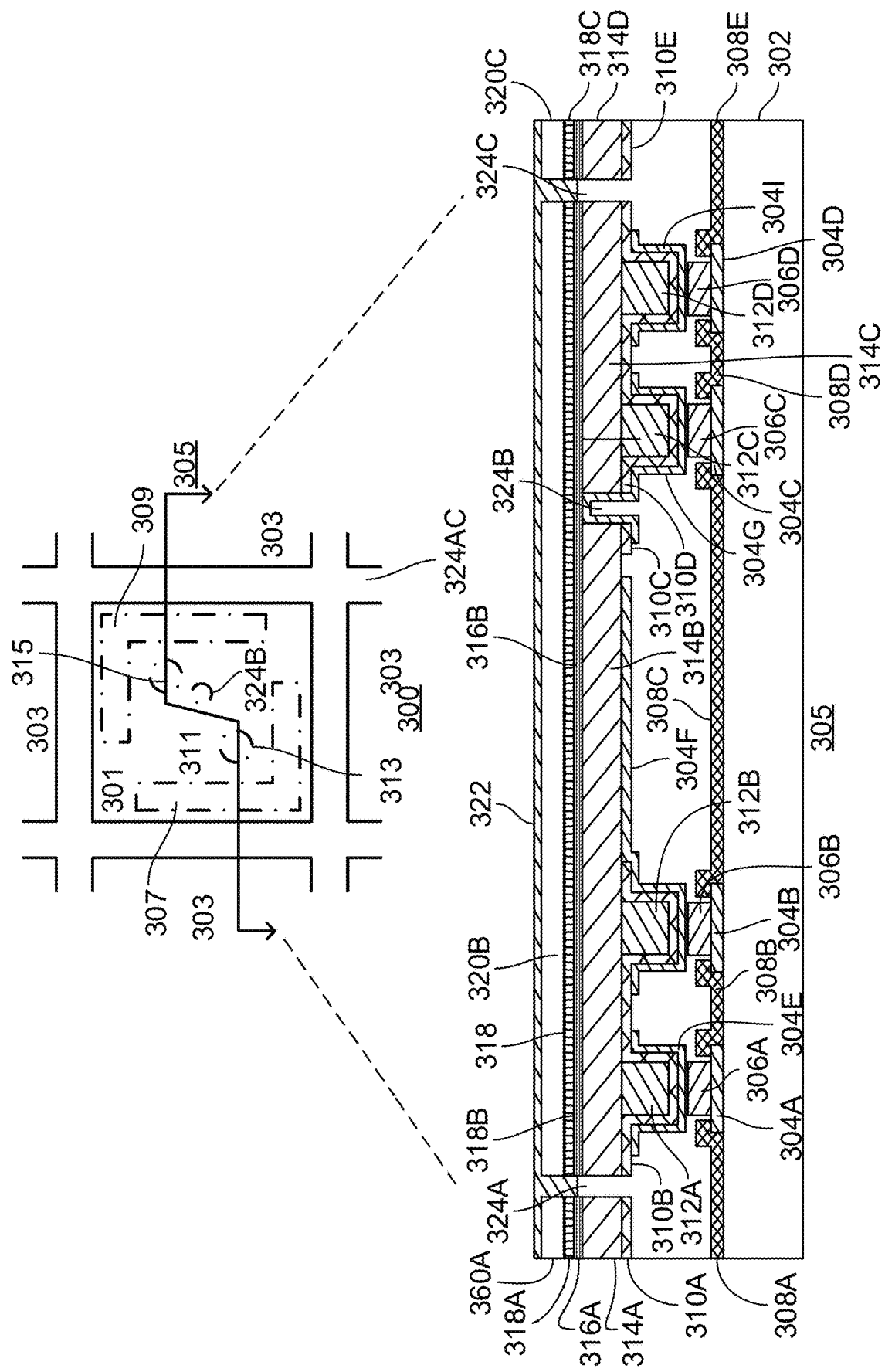
FIG. 3C shows an exemplary top and section view of a third embodiment of a dual electrode PMUT device including a series-connected piezoelectric element in accordance with an embodiment of the present disclosure.

FIG. 3C shows an exemplary top and section view of a third embodiment of a dual electrode PMUT device including a series-connected piezoelectric element in accordance with an embodiment of the present disclosure. Most of the components of the embodiment of FIG. 3C are substantially identical to those described in FIG. 3A or 3B, for example, including but not limited to the material layers and components from the processing layer 302 through the piezoelectric layer portions 314A-314C. As in the exemplary embodiment of FIG. 3B, the trenches 324A and 324C may extend through additional layers. In the exemplary embodiment of FIG. 3C the trenches 324A and 324C may extend through some, but not all, of the upper wafer layers of the PMUT device 301 (e.g., seed layer 318 and structural layer 320), but not insulating layer 322. In this manner, the insulating layer 322 forms a physical connection between PMUT device 301 and adjacent PMUT devices 303, but does not provide a path for electrical signals to pass between PMUT devices. In the exemplary embodiment of FIG. 3C, the insulating layer 322 may be processed at an appropriate time and in an appropriate manner (e.g., after trenches are formed through other layers) such that a portion of the insulating material (e.g., SiO₂) of insulating layer 322 is deposited in and extends into the trenches 324A and 324C. Although the insulating layer may extend to different depths within the trenches 324A and 324C (e.g., including no extension at all or past the structural layer to further electrically isolate the conductive plane layers from each other), in the exemplary embodiment of FIG. 3C the insulating layer may extend to substantially cover the exposed portions of the structural layer 320A/320B/320C within the trench.

In the exemplary embodiment of FIG. 3C, trenches 324A and 324C extend through the insulating layer 310, piezoelectric layer 314, conductive plane layer 316, seed layer 318, and structural layer 320 to physically and electrically separate these adjacent layers from each other between adjacent PMUT devices. In the embodiment of FIG. 3C, insulating layer portion 310A, piezoelectric layer portion 314A, conductive plane layer portion 316A, seed layer portion 318A, and structural layer portion 320A may all be components of an adjacent PMUT device 303 to the left of PMUT device 301 (not depicted in additional detail in FIG. 3C) while insulating layer portion 310E, piezoelectric layer portion 314D, conductive plane layer portion 316C, seed layer portion 318C, and structural layer portion 320C may all be components of an adjacent PMUT device 303 to the right of PMUT device 301 (not depicted in additional detail in FIG. 3C). In this manner, trenches 324A and 324C serve to separate adjacent PMUT devices, and particularly, the conductive plane layers 316 of adjacent PMUT devices, such that signals may be independently provided to and received by the respective conductive plane layers. In the exemplary embodiment of FIG. 3C the only physical connection between adjacent PMUT devices is via insulating layer 322, such that it is not possible for even parasitic signals to pass between adjacent PMUT devices.

In the exemplary embodiment of FIG. 3C, via 324B extends between insulating layer portions 310C and 310D, and further between piezoelectric layer portions 314B and 314C and seed layer portions 318B and 318C. In this manner, electrode 304G may be formed in via 324B in order to connect conductive plane layer portion 316B to processing layer 302 (e.g., via germanium bond 306C and contact pad 306C). This connection allows components of processing layer 302 direct electrical access and control of the signals provided to and received by conductive plane layer portion 316B of PMUT device 301. Although not depicted in FIG. 3C, in some embodiments, via 324B may not extend through the conductive plane layer to the seed layer, such that the electrode 304G provides an electrical connection to the bottom of a portion of the conductive plane layer portion 316B. Although the via 324B may have a variety of suitable shapes, in an exemplary embodiment as depicted in FIG. 3C the via 324B may be generally cylindrical in shape.

Figure 3D:
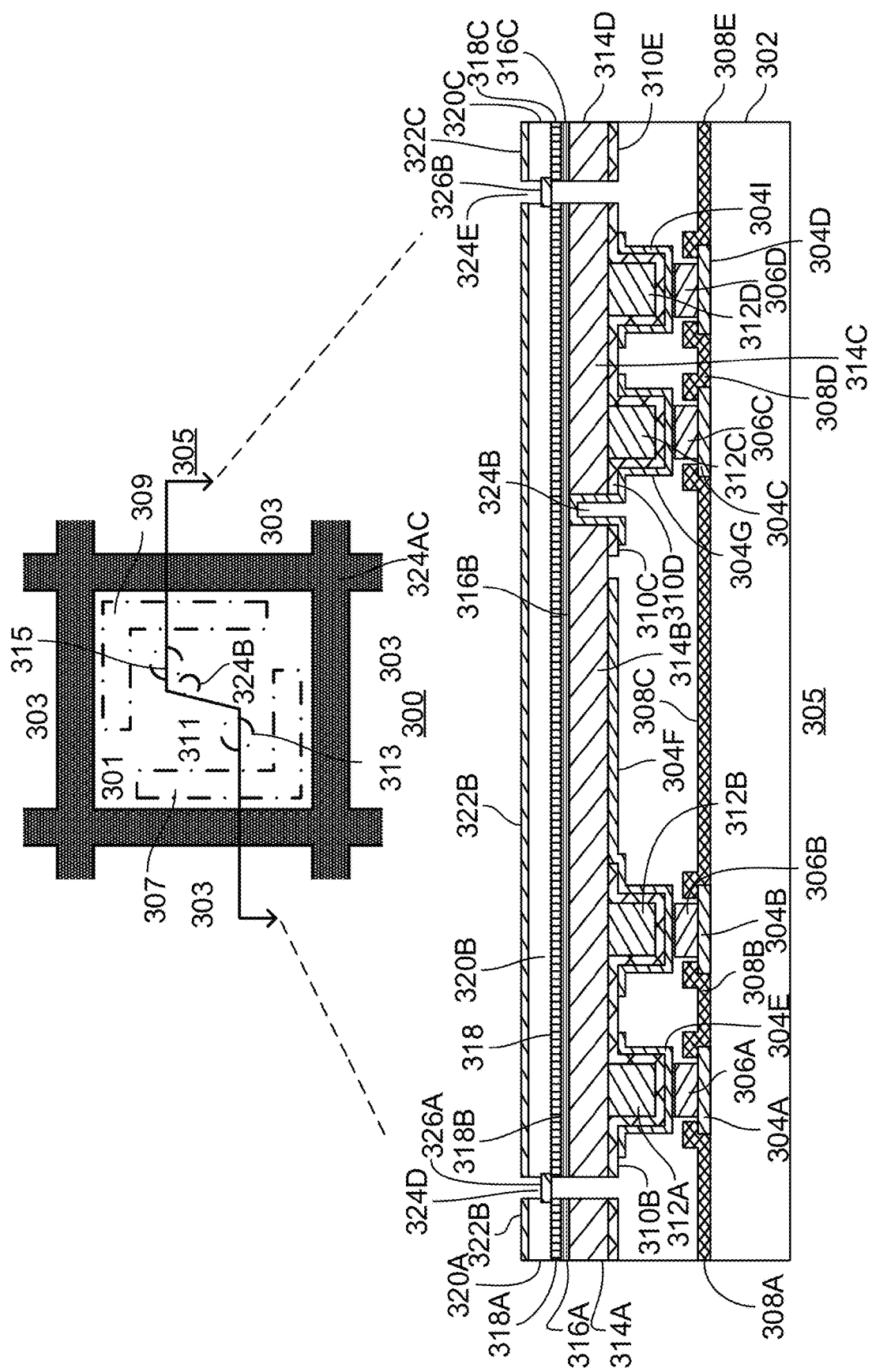
FIG. 3D shows an exemplary top and section view of a fourth embodiment of a dual electrode PMUT device including a series-connected piezoelectric element in accordance with an embodiment of the present disclosure.

FIG. 3D shows an exemplary top and section view of a fourth embodiment of a dual electrode PMUT device including a series-connected piezoelectric element in accordance with an embodiment of the present disclosure. Most of the components of the embodiment of FIG. 3D are substantially identical to those described in FIG. 3A, FIG. 3B, or FIG. 3C, for example, including but not limited to the material layers and components from the processing layer 302 through the piezoelectric layer portions 314A-314D. In the exemplary embodiment of FIG. 3D, trenches 324A and 324C may extend through the insulating layer 310, piezoelectric layer 314, conductive plane layer 316, and seed layer 318 to insulating "plugs" 326A and 326B (e.g., of an insulating material such as SiO₂), which are associated with trenches 324A and 324C, respectively. Although the insulating plugs 326A and 326B are depicted in FIG. 3D as having a lower surfaces in contact with insulating layers 320A/320B/320C, in other embodiments the insulating plugs may be located at different locations and have different thicknesses. Additional trenches 324D and 324E may be formed opposite trenches 324A and 324C to the other side of insulating plugs 326A and 326B. In this manner, the insulating plugs 326A and 326D form a physical connection between PMUT device 301 and adjacent PMUT devices 303, but do not provide a path for electrical signals to pass between PMUT devices. In the exemplary embodiment of FIG. 3D, the insulating plugs 326 may be processed at an appropriate time and in an appropriate manner (e.g., as described herein) such that a portion of the insulating material (e.g., SiO₂) of insulating plugs 326 is deposited within the adjacent structural layers.

In the exemplary embodiment of FIG. 3D, trenches 324A and 324C extend through the insulating layer 310, piezoelectric layer 314, conductive plane layer 316, and seed layer 318 to physically and electrically separate these adjacent layers from each other between adjacent PMUT devices. Trenches 324D and 324E, along with insulating plugs 326A and 326B, physically and electrically separate the structural layers 320 and insulating layers 322 from each other between adjacent PMUT devices. In the embodiment of FIG. 3D, insulating layer portion 310A, piezoelectric layer portion 314A, conductive plane layer portion 316A, seed layer portion 318A, structural layer portion 320A, and insulating layer portion 322A may all be components of an adjacent PMUT device 303 to the left of PMUT device 301 (not depicted in additional detail in FIG. 3C) while insulating layer portion 310E, piezoelectric layer portion 314D, conductive plane layer portion 316C, seed layer portion 318C, structural layer portion 320C, and insulating layer portion 322C may all be components of an adjacent PMUT device 303 to the right of PMUT device 301 (not depicted in additional detail in FIG. 3D). In this manner, trenches 324A, 324C, 324D, and 324E and insulating plugs 326A and 326B serve to separate adjacent PMUT devices, and particularly, the conductive plane layers 316 of adjacent PMUT devices, such that signals may be independently provided to and received by the respective conductive plane layers. In the exemplary embodiment of FIG. 3D the only physical connection between adjacent PMUT devices is via insulating plugs 326A and 326B, such that it is not possible for even parasitic signals to pass between adjacent PMUT devices.

In the exemplary embodiment of FIG. 3D, via 324B extends between insulating layer portions 310C and 310D, and further between piezoelectric layer portions 314B and 314C, conductive plane layer portions 326B and 326C, and seed layer portions 318B and 318C. In this manner, electrode 304G may be formed in via 324B in order to connect conductive plane layer portion 316B to processing layer 302 (e.g., via germanium bond 306C and contact pad 304C). This connection allows components of processing layer 302 direct electrical access and control of the signals provided to and received by conductive plane layer portion 316B of PMUT device 301. Although not depicted in FIG. 3D, in some embodiments via 324B may not extend through the conductive plane layer to the seed layer, such that the electrode 304G provides an electrical connection to the bottom of a portion of the conductive plane layer portion 316B. Although via 324B may have a variety of suitable shapes, in an exemplary embodiment as depicted in FIG. 3D the via 324B may be generally cylindrical in shape.

Although particular locations and types of trenches are depicted in FIGS. 3A-3D, it will be understood that trenches may be formed at different and/or additional locations in order to provide desired electrical and physical separation (or for vias used to form electrode connections, to provide electrical and physical connections). In an exemplary embodiment, trenches may be formed from the top of the upper wafer layers through to insulating layers or components such as insulating layers 310B/310D and/or standoffs 312A/312B/312C/312D. In this manner, trenches may be formed through insulating layer 322, structural layer 320, seed layer 318, conductive plane layer 316, and piezoelectric layer 314. In some embodiments, the insulating layers 310B/310D and/or standoffs 312A/312B/312C/312D may form a physical connection between adjacent PMUT devices, while the trenches and connecting materials prevent electrical connection between adjacent PMUT devices. The trenches may also relieve any stress in the upper layers of the sensor stack. The trenches may be filled with material that also has a certain elasticity or flexibility to further absorb stress, e.g., due to stressing, flexing or bending or the substrate and/or sensor.

Figure 4A:
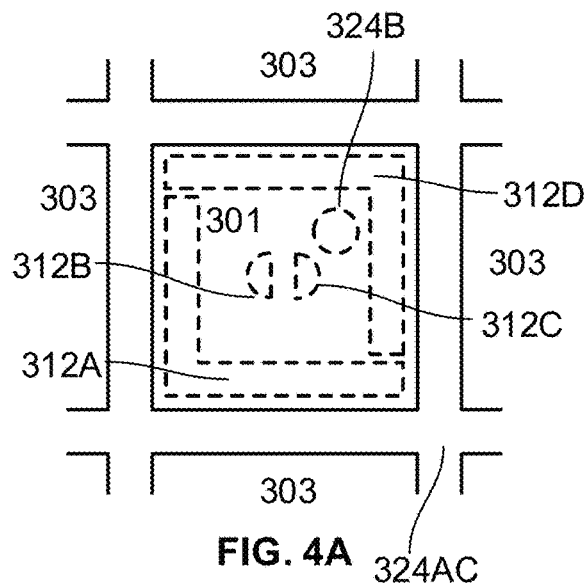
FIG. 4A shows an exemplary top view of a PMUT array including dual electrode PMUT devices in accordance with an embodiment of the present disclosure.

FIG. 4A shows an exemplary top view of a PMUT array including dual electrode PMUT devices in accordance with an embodiment of the present disclosure. In the exemplary embodiment of FIG. 4A, the active electrical connections to the active electrode below the piezoelectric layer (e.g., electrode 304E overlaying standoff 312B) and the conductive plane layer above the piezoelectric layer (e.g., electrode 304F overlaying standoff 312C) are located near the center point of the PMUT device 301. A via 324B may be provided in any suitable location to connect the conductive plane layer to the processing layer as described herein. In the exemplary embodiment of FIG. 4A, the standoffs 312B and 312C are semicircles that collectively form a circle at the center of the PMUT device 301, although other shapes (e.g., circles with connections on different sides, ovals, rectangles, squares, etc.) may be chosen for the standoffs based on desired piezoelectric response characteristics of the PMUT device 301, ease and speed of processing operations, and the like. Moreover, spacing and sizing of centrally located internal electrodes may be modified. The electrically inactive standoffs (e.g., standoffs 312A and 312D) may be located about respective edges of the PMUT device to provide edge support for the piezoelectric layer, e.g., to create a particular resonator shape and profile for the movable piezoelectric membrane. In the exemplary embodiment depicted in FIG. 4A, these two complementary standoffs may substantially surround the piezoelectric layer to create a square-shaped resonator, although other numbers and shapes of inactive electrodes (e.g., circles, complex patterns, etc.) may be utilized. A trench 324AC collectively formed by trenches 324A and 324C electrically isolates PMUT device 301 and other PMUT devices 303 (e.g., as described in any of FIGS. 3A-3D above) while via 324B connects an active electrode to the conductive plane layer (not depicted).

Figure 4B:
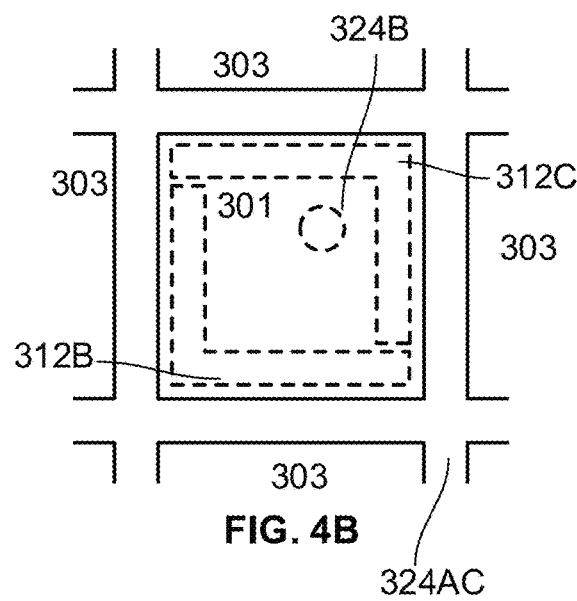
FIG. 4B shows an exemplary top view of a PMUT array including dual electrode PMUT devices in accordance with an embodiment of the present disclosure.

FIG. 4B shows an exemplary top view of a PMUT array including dual electrode PMUT devices in accordance with an embodiment of the present disclosure. In the exemplary embodiment of FIG. 4B, the active electrical connections to the active electrode below the piezoelectric layer (e.g., electrode 304E overlaying standoff 312B) and the conductive plane layer above the piezoelectric layer (e.g., electrode 304F overlaying standoff 312C) are located at the edges of the PMUT device 301 and substantially surround the PMUT device, providing both electrical connection and physical support for the piezoelectric layer. A via 324B may be provided in any suitable location to connect the conductive plane layer to the processing layer as described herein. In the exemplary embodiment of FIG. 4B, the standoffs 312B and 312C associated with active electrical connections collectively define a square shape to provide edge support for the piezoelectric layer, e.g., to create a particular resonator shape and profile for the movable piezoelectric membrane. In the exemplary embodiment depicted in FIG. 4B, these two complementary standoffs may substantially surround the piezoelectric layer to create a square-shaped resonator, although other shapes of active supporting electrodes (e.g., circles, complex patterns, etc.) may be utilized. A trench 324AC collectively formed by trenches 324A and 324C electrically isolates PMUT device 301 and other PMUT devices 303 (e.g., as described in any of FIGS. 3A-3D above) while via 324B connects active electrode 304F to the conductive plane layer (not depicted).

Figure 4C:
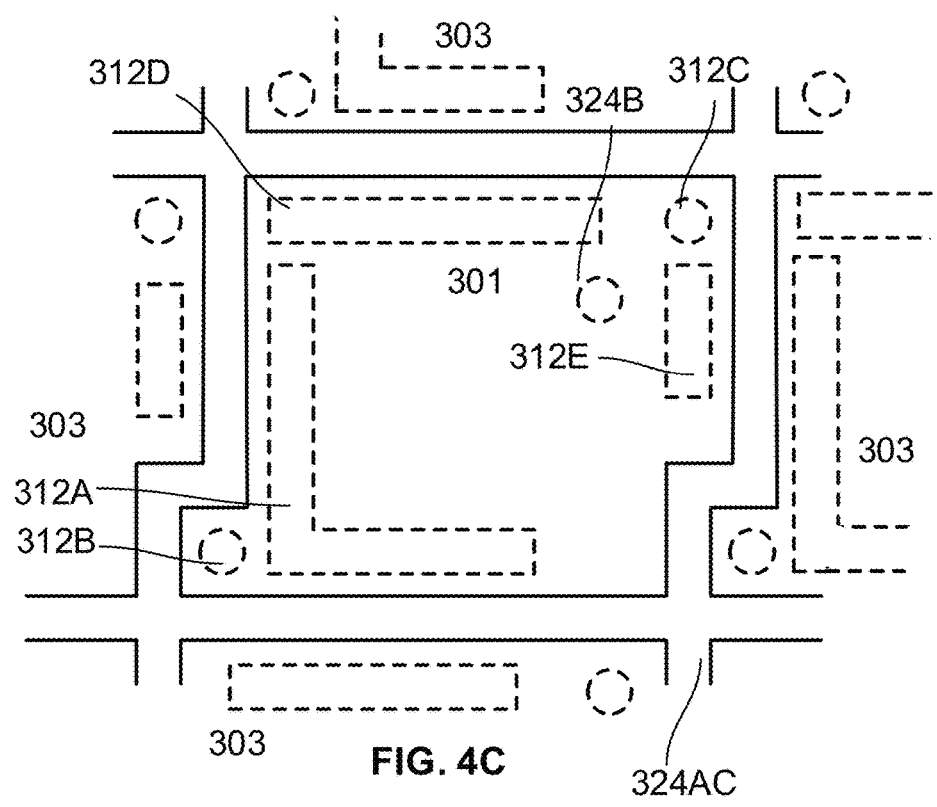
FIG. 4C shows an exemplary top view of a PMUT array including dual electrode PMUT devices in accordance with an embodiment of the present disclosure.

FIG. 4C shows an exemplary top view of a PMUT array including dual electrode PMUT devices in accordance with an embodiment of the present disclosure. In the exemplary embodiment of FIG. 4C, the active electrical connections to the active electrode below the piezoelectric layer (e.g., electrode 304E overlaying standoff 312B) and the conductive plane layer above the piezoelectric layer (e.g., electrode 304F overlaying standoff 312C) are located at the edges of the PMUT device 301 between adjacent PMUT devices 303. A via 324B may be provided in any suitable location to connect the conductive plane layer to the processing layer as described herein. In the exemplary embodiment of FIG. 4C, the standoffs 312B and 312C are circular, although other shapes (e.g., circles, ovals, rectangles, squares, etc.) may be chosen for the standoffs based on desired piezoelectric response characteristics of the PMUT devices 301 and 303, ease and speed of processing operations, and the like. Moreover, spacing and sizing of centrally located internal electrodes may be modified. The electrically inactive standoffs (e.g., standoffs 312A, 312D, and 312E) may be located about respective edges of the PMUT device to provide edge support for the piezoelectric layer, e.g., to create a particular resonator shape and profile e.g., to create a particular resonator shape and profile for the movable piezoelectric membrane. In the exemplary embodiment depicted in FIG. 4C, these two complementary standoffs may substantially surround the piezoelectric layer to create a square-shaped resonator, although other numbers and shapes of inactive electrodes (e.g., circles, complex patterns, etc.) may be utilized. A trench 324AC collectively formed by trenches 324A and 324C electrically isolates PMUT device 301 and other PMUT devices 303 (e.g., as described in any of FIGS. 3A-3D above) while via 324B connects active electrode 304F to the conductive plane layer (not depicted).

FIGS. 5A through 15 depict exemplary steps for fabricating an exemplary PMUT device of the present disclosure, such as the exemplary PMUT device of FIG. 3D. Although particular steps are depicted and described in a particular order, it will be understood that one or more steps may be omitted or added in accordance with the present disclosure. In some embodiments, different materials or combinations of materials may be utilized to perform similar functions, and a variety of suitable operations may be utilized for depositing, treating, doping, removing, bonding and otherwise processing the PMUT device.

Figure 5A:
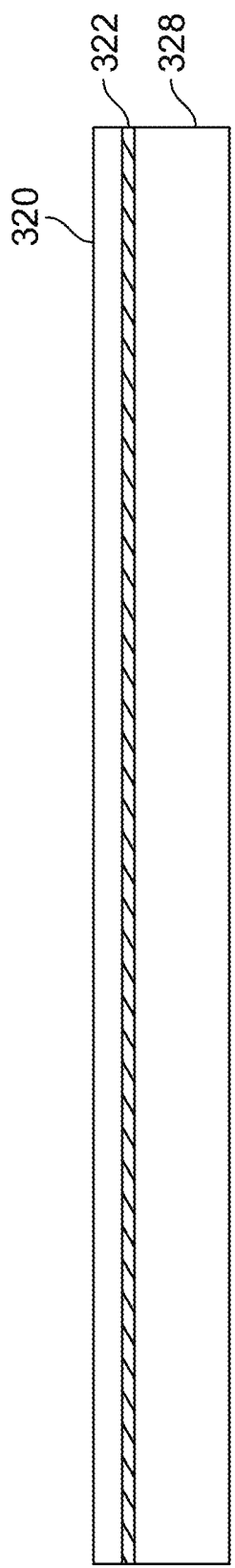
FIG. 5A shows an exemplary step of fabricating a structural portion of the dual electrode PMUT device of FIG. 3D in accordance with an embodiment of the present disclosure.

FIG. 5A shows an exemplary step of fabricating a structural portion of the dual electrode PMUT device of FIG. 3D in accordance with an embodiment of the present disclosure. At the step of FIG. 5A, a wafer may be prepared including an underlying handle layer 328 (e.g., a silicon layer), an insulating layer 322 (e.g., an $SiO_2$ layer), and a structural layer 320 (e.g., a silicon layer).

Figure 5B:
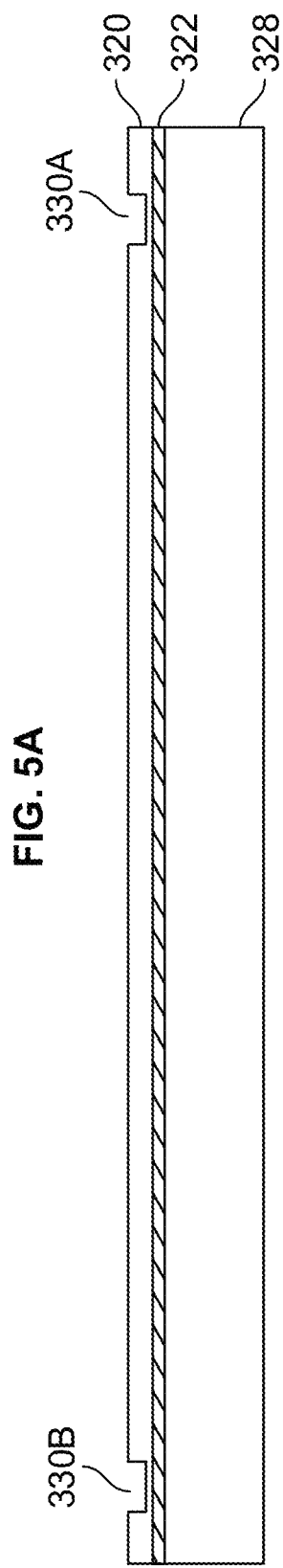
FIG. 5B shows an exemplary step of removing material from the structural portion of the dual electrode PMUT device of FIG. 3D in accordance with an embodiment of the present disclosure.

FIG. 5B shows an exemplary step of removing material from the structural portion of the dual electrode PMUT device of FIG. 3D in accordance with an embodiment of the present disclosure. At the step of FIG. 5B, trenches 330A and 330B may be etched in structural layer 320. For example, although not depicted in the side view of FIG. 5B, the trenches 330A and 330B may collectively form a single trench 330 that surrounds a portion of the structural layer 320.

Figure 5C:
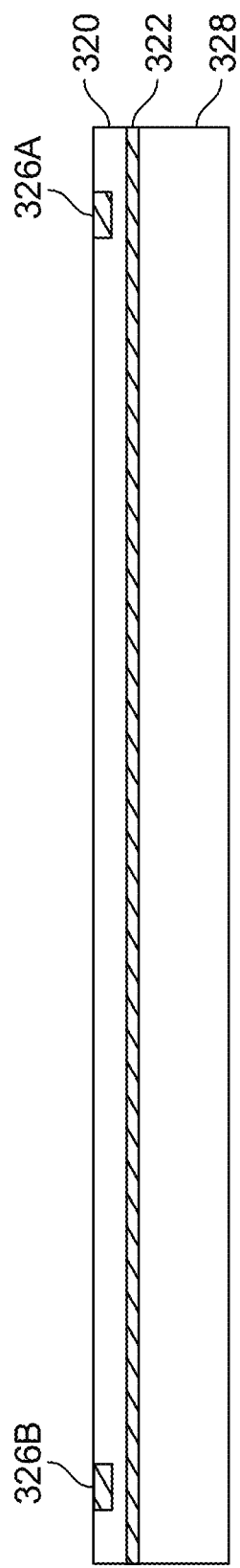
FIG. 5C shows an exemplary step of depositing an insulating plug within the structural portion of the dual electrode PMUT device of FIG. 3D in accordance with an embodiment of the present disclosure.

FIG. 5C shows an exemplary step of depositing an insulating plug within the structural portion of the dual electrode PMUT device of FIG. 3D in accordance with an embodiment of the present disclosure. At the step of FIG. 5C, the insulating plugs 326A and 326B (e.g., refilled $SiO_2$ insulating plugs) may be deposited within the trenches 330A and 330B respectively, for example, to surround a portion of the structural layer 320.

FIG. 6 shows exemplary steps of fabricating a seed layer, conductive layer, piezoelectric layer, and standoffs of the dual electrode PMUT device of FIG. 3D in accordance with an embodiment of the present disclosure. At the steps of FIG. 6, seed layer 318 may be deposited, and may provide a layer to assist in the formation and deposition of the conductive plane layer 316. Piezoelectric layer 314 may be deposited over the conductive plane layer, and standoffs 312A-312D deposited over the piezoelectric layer at locations as described herein.

FIG. 7 shows exemplary steps of fabricating an insulating layer and via of the dual electrode PMUT device of FIG. 3D in accordance with an embodiment of the present disclosure. At the steps of FIG. 7, a patterned insulating layer 310 may be deposited and patterned over the piezoelectric layer and standoffs, leaving an exposed portion for formation (e.g., by etching) of via 324B, which in the exemplary embodiment of FIG. 7 may be etched through the piezoelectric layer 314, conductive plane layer 316, and seed layer 318 to structural layer 320. In this manner, via 324B may provide a path for providing an electrical connection to conductive plane layer 316.

Figure 8:
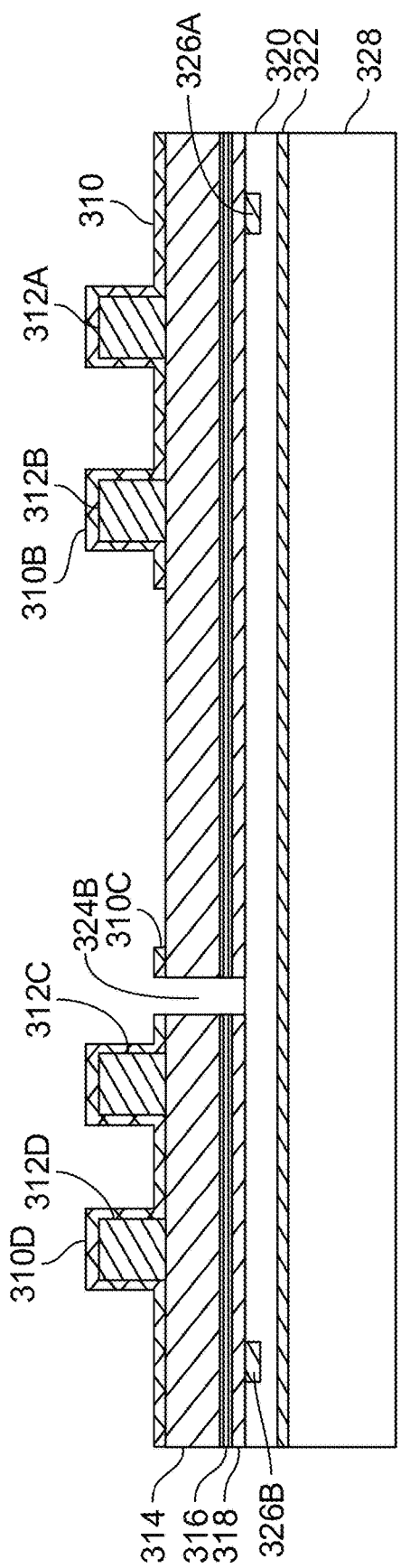
FIG. 8 shows exemplary steps of patterning the insulating layer of the dual electrode PMUT device of FIG. 3D in accordance with an embodiment of the present disclosure.

FIG. 8 shows exemplary steps of patterning the insulating layer of the dual electrode PMUT device of FIG. 3D in accordance with an embodiment of the present disclosure. At the steps of FIG. 8, the insulating layer 310 may be further patterned to provide a pattern for depositing an electrode that will be in contact with a portion of the surface of piezoelectric layer 314 that is located opposite conductive plane layer 316. The patterning of FIG. 8 forms insulating layer 310 portions 310B, 310C, and 310D.

Figure 9:
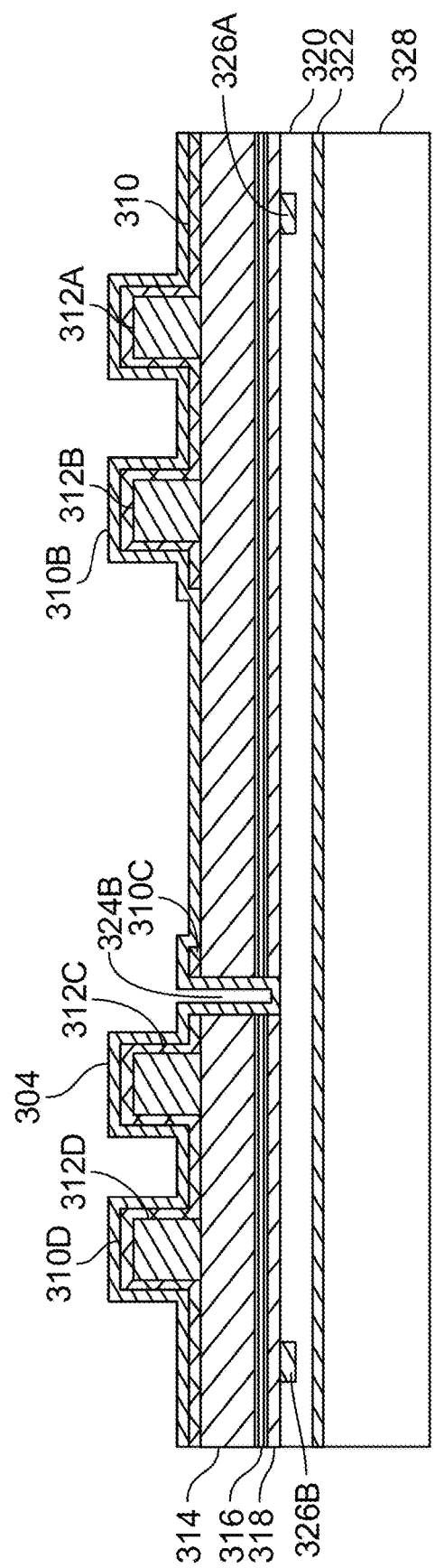
FIG. 9 shows exemplary steps of fabricating an electrode layer of the dual electrode PMUT device of FIG. 3D in accordance with an embodiment of the present disclosure.

FIG. 9 shows exemplary steps of fabricating an electrode layer of the dual electrode PMUT device of FIG. 3D in accordance with an embodiment of the present disclosure. At the step of FIG. 9, a conductive electrode layer 304 is deposited over the exposed surfaces of the via 324B, piezoelectric layer 314, and insulating layer portions 310B, 310C, and 310D.

Figure 10:
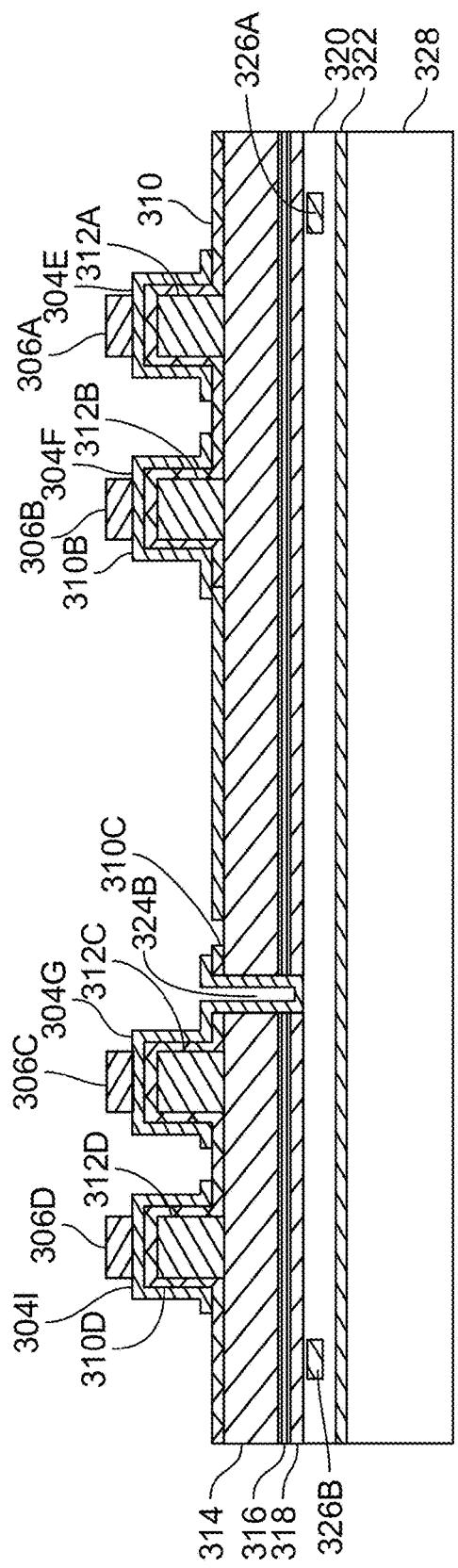
FIG. 10 shows exemplary steps of fabricating bonding contacts and patterning the electrode layer of the dual electrode PMUT device of FIG. 3D in accordance with an embodiment of the present disclosure.

FIG. 10 shows exemplary steps of fabricating bonding contacts and patterning the electrode layer of the dual electrode PMUT device of FIG. 3D in accordance with an embodiment of the present disclosure. At the steps of FIG. 10, the electrode layer 304 is patterned to form inactive electrodes 304E and 304I and active electrodes 304F and 304G, with active electrode 304F overlaying a first surface of the piezoelectric layer 314 and active electrode 304G deposited in via 324B to form an electrical connection with conductive plane layer 316. Germanium bonding portions 306A-306D may be formed over respective electrodes 304E-304I and standoffs 312A-312D.

Figure 11:
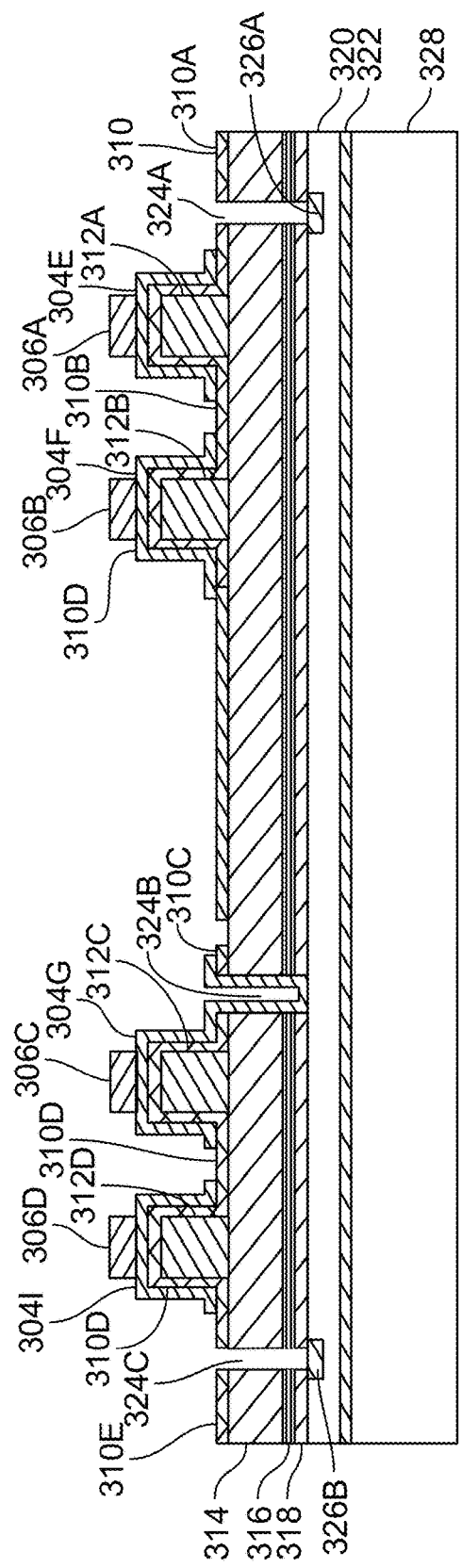
FIG. 11 shows exemplary steps of fabricating an isolation trench of the dual electrode PMUT device of FIG. 3D in accordance with an embodiment of the present disclosure.

FIG. 11 shows exemplary steps of fabricating an isolation trench of the dual electrode PMUT device of FIG. 3D in accordance with an embodiment of the present disclosure. At the steps of FIG. 11, trenches 324A and 324C may be formed, for example, by etching through the insulating layer 310, piezoelectric layer 314, conductive plane layer 316, and seed layer 318. In this manner, trench 324A may be etched to insulating plug 326A and trench 324C may be etched to insulating plug 326B. Although depicted as two separate trenches in some of the views provided herein, the isolation trench may extend around the conductive plane layer 316 to isolate the conductive plane layer from adjacent PMUT devices.

Figure 12:
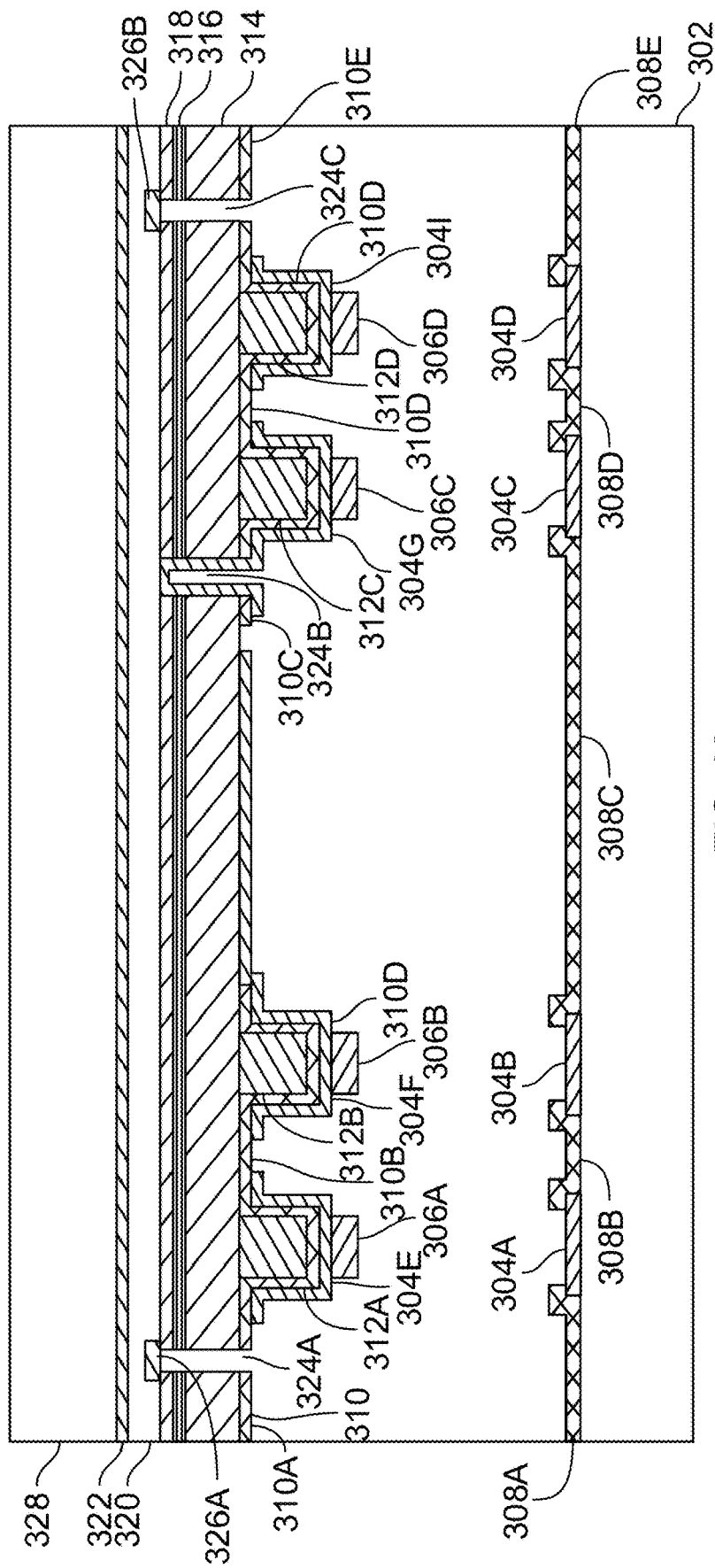
FIG. 12 shows exemplary steps of aligning piezoelectric and electrical control portions of the dual electrode PMUT device of FIG. 3D in accordance with an embodiment of the present disclosure.

FIG. 12 shows exemplary steps of aligning piezoelectric and electrical control portions of the dual electrode PMUT device of FIG. 3D in accordance with an embodiment of the present disclosure. In additional processing steps (not depicted in FIGS. 5-15), a processing wafer may be fabricated that includes processing layer 302, insulating layer 308A-308E, and contact pads 304A-304D formed between the insulating layers 308A-308E and forming electrical connections with components of processing layer 302. At the steps of FIG. 12, the contact pads 304A-304D may be aligned with respective germanium bonding portions 306A-306D.

Figure 13:
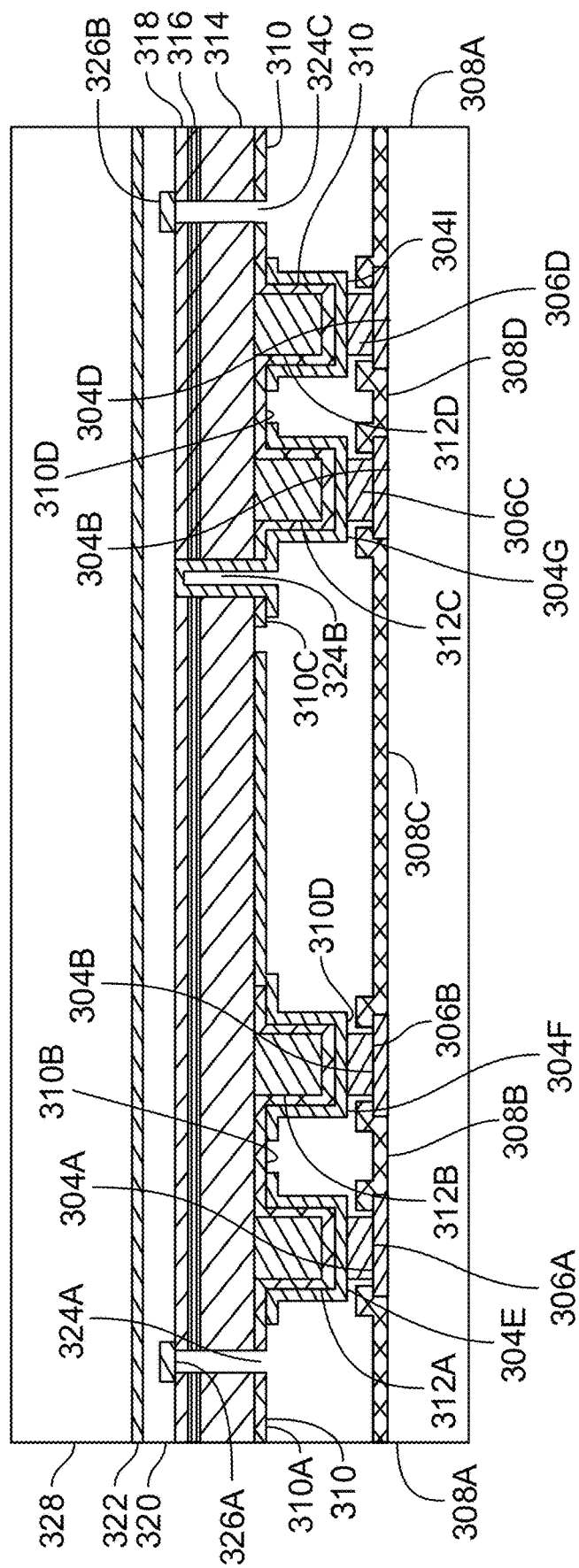
FIG. 13 shows exemplary steps of bonding piezoelectric and electrical control portions of the dual electrode PMUT device of FIG. 3D in accordance with an embodiment of the present disclosure.

FIG. 13 shows exemplary steps of bonding piezoelectric and electrical control portions of the dual electrode PMUT device of FIG. 3D in accordance with an embodiment of the present disclosure. At the steps of FIG. 13, electrodes 304A-304D may be bonded to respective germanium bonding portions 306A-306D, resulting in an electrical connection between components of processing layer 302 and a lower surface of piezoelectric layer 314 (e.g., via electrode 304B, germanium bonding portion 306B, and electrode 304F) and an upper surface of piezoelectric layer 314 (e.g., via electrode 304C, germanium bonding portion 306C, and electrode 304G).

Figure 14:
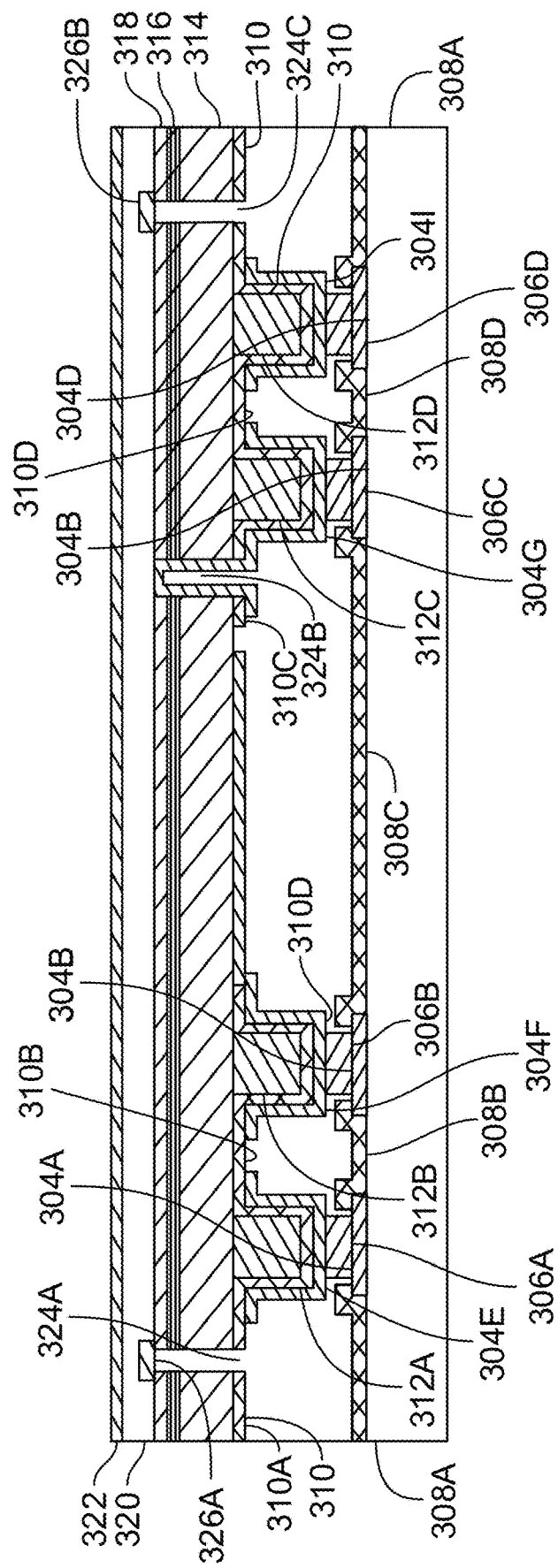
FIG. 14 shows exemplary steps of material removal from the dual electrode PMUT device of FIG. 3D in accordance with an embodiment of the present disclosure.

FIG. 14 shows exemplary steps of material removal from the dual electrode PMUT device of FIG. 3D in accordance with an embodiment of the present disclosure. At the steps of FIG. 14, the handle layer 328 may be removed, exposing the insulating layer 322.

Figure 15:
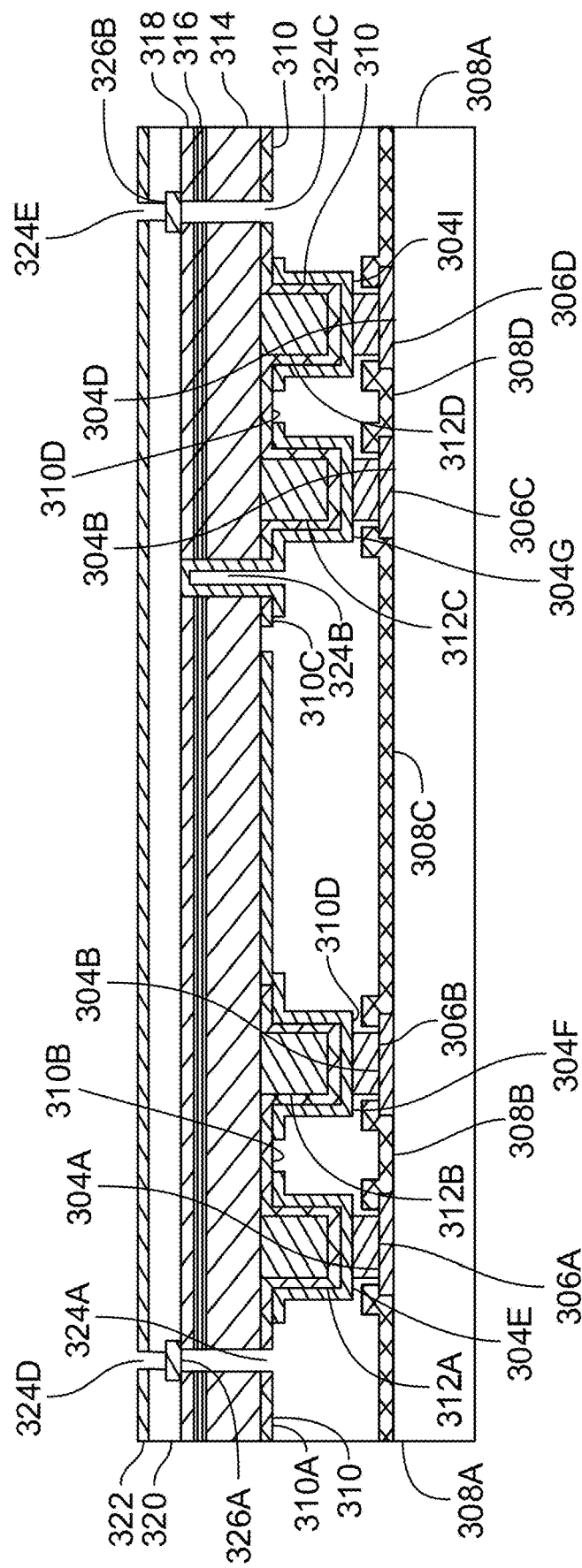
FIG. 15 shows exemplary steps of fabricating additional trenches to the plugs of the dual electrode PMUT device of FIG. 3D in accordance with an embodiment of the present disclosure.

FIG. 15 shows exemplary steps of fabricating additional trenches to the plugs of the dual electrode PMUT device of FIG. 3D in accordance with an embodiment of the present disclosure. At the steps of FIG. 15, additional trenches 324D and 324E may be etched to the insulating plugs 326A and 326B respectively, electrically and physically isolating PMUT device 301 from adjacent PMUT devices 303, except for the physical connection via insulating plugs 326A and 326B.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A piezoelectric micromachined ultrasonic transducer (PMUT) device, comprising:
a processing layer;
a piezoelectric layer;
a structural layer;
an electrode located between the piezoelectric layer and the processing layer;
a conductive plane layer located between the piezoelectric layer and the structural layer;
a first electrical connection between the processing layer and the electrode;
a second electrical connection between the processing layer and the conductive plane layer, wherein the second electrical connection extends through the piezoelectric layer; and
an isolation trench that extends through the conductive plane layer and at least one of the piezoelectric layer or the structural layer, wherein the isolation trench surrounds the conductive plane layer within the PMUT device.

2. The PMUT device of claim 1, wherein the isolation trench extends through the piezoelectric layer and the conductive plane layer.

3. The PMUT device of claim 2, further comprising a seed layer located between the conductive plane layer and the structural layer, wherein the isolation trench extends through the piezoelectric layer and the conductive plane layer to the seed layer.

4. The PMUT device of claim 2, wherein the isolation trench further extends through the structural layer.

5. The PMUT device of claim 4, further comprising an insulating layer located on an opposite side of the structural layer from the conductive plane layer, wherein the insulating layer extends within the isolation trench from the opposite side of the structural layer to fill a portion of the isolation trench.

6. The PMUT device of claim 4, further comprising an insulating plug located within the isolation trench and extending between portions of the structural layer within the structural layer.

7. The PMUT device of claim 6, wherein the insulating plug surrounds the structural layer within the PMUT device.

8. The PMUT device of claim 1, wherein the isolation trench extends through structural layer and the conductive plane layer.

9. The PMUT device of claim 8, wherein the isolation trench extends through structural layer and the conductive plane layer to the piezoelectric layer.

10. The PMUT device of claim 8, wherein the isolation trench further extends through the piezoelectric layer.

11. The PMUT device of claim 10, further comprising an insulating layer between the piezoelectric layer and the processing layer, wherein the isolation trench extends through the piezoelectric layer to the insulating layer.

12. The PMUT device of claim 11, wherein the insulating layer comprises a standoff.

13. The PMUT device of claim 1, wherein the processing layer comprises processing circuitry for transmitting ultrasonic waves using the piezoelectric layer during a first time period and receiving ultrasonic waves by using the piezoelectric layer during a second period.

14. The PMUT device of claim 13, wherein the processing circuitry is further configured to generate a signal for identifying a characteristic of an external target based on a received signal.

15. The PMUT device of claim 13, wherein the processing circuitry comprises a first amplifier coupled to the electrode via the first electrical connection to provide an excitation signal and a second amplifier coupled to the conductive plane layer via the second electrical connection to receive a reflection signal.

16. The PMUT device of claim 1, further comprising:
a first standoff, wherein the first electrical connection extends over the first standoff between the processing layer and the electrode; and
a second standoff, wherein the second electrical connection extends over the second standoff between the processing layer and the piezoelectric layer.

17. The PMUT device of claim 16, further comprising a third standoff not connected to the electrode or the conductive plane to provide mechanical support.

18. The PMUT device of claim 16, wherein one of the first standoff or the second standoff is centrally located within the PMUT device and wherein the other of the first standoff or the second standoff is located proximate to an outer edge of the PMUT device.

19. The PMUT device of claim 16, wherein both of the first standoff and the second standoff are centrally located within the PMUT device.

20. A piezoelectric micromachined ultrasonic transducer (PMUT) array, comprising:
a plurality of PMUT devices, each of the PMUT devices comprising;
a piezoelectric layer;
a structural layer;
an electrode located between the piezoelectric layer and the processing layer;
a conductive plane layer located between the piezoelectric layer and the structural layer;

a first electrical connection between the processing layer and the electrode; and a second electrical connection between the processing layer and the conductive plane layer, wherein the second electrical connection extends through the piezoelectric layer; and a plurality of isolation trenches that extend through the conductive plane layers of adjacent PMUT devices, wherein the plurality of isolation trenches electrically isolate the conductive plane layers of the adjacent PMUT devices from each other.

21. A method of fabricating a piezoelectric micromachined ultrasonic transducer (PMUT) device, comprising:

preparing a structural wafer comprising at least an insulating oxide layer and a structural layer;

depositing a conductive plane layer over the structural layer;

depositing a piezoelectric layer over the conductive plane layer;

depositing a plurality of oxide standoffs over a portion of the piezoelectric layer;

etching a via through the piezoelectric layer at least to the conductive plane layer;

depositing an electrical connection layer over the standoffs and the piezoelectric layer, wherein the electrical connection layer extends into the via at least to the conductive plane layer;

patterning the electrical connection layer; and etching a plurality of trenches, where the plurality of trenches extend through the piezoelectric layer and the conductive plane layer to surround the conductive plane layer within the PMUT device.

* * * * *